United States Patent
Hung et al.

(10) Patent No.: US 12,009,208 B2
(45) Date of Patent: Jun. 11, 2024

(54) DEPOSITION EQUIPMENT WITH ADJUSTABLE TEMPERATURE SOURCE

(71) Applicant: Taiwan Semiconductor Manufacturing Company, Ltd., Hsin-Chu (TW)

(72) Inventors: Chih Yung Hung, Hsinchu (TW); Shahaji B. More, Hsinchu (TW); Chien-Feng Lin, Hsinchu County (TW); Cheng-Han Lee, New Taipei (TW); Shih-Chieh Chang, Taipei (TW); Ching-Lun Lai, Taichung (TW); Wei-Jen Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 66 days.

(21) Appl. No.: 17/545,625

(22) Filed: Dec. 8, 2021

(65) Prior Publication Data
US 2022/0392767 A1 Dec. 8, 2022

Related U.S. Application Data

(60) Provisional application No. 63/197,642, filed on Jun. 7, 2021.

(51) Int. Cl.
| | | |
|---|---|---|
| H01L 21/02 | (2006.01) | |
| C30B 25/10 | (2006.01) | |
| C30B 25/12 | (2006.01) | |
| C30B 25/16 | (2006.01) | |
| H01L 21/268 | (2006.01) | |
| H01L 21/66 | (2006.01) | |
| H01L 21/687 | (2006.01) | |

(52) U.S. Cl.
CPC ...... *H01L 21/02636* (2013.01); *C30B 25/105* (2013.01); *C30B 25/12* (2013.01); *C30B 25/16* (2013.01); *H01L 21/268* (2013.01); *H01L 21/68764* (2013.01); *H01L 22/20* (2013.01)

(58) Field of Classification Search
CPC ......... H01L 21/67115; H01L 21/68764; H01L 21/67248; C23C 16/46; C23C 16/4584; C23C 14/505; C23C 14/541; C23C 16/481
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |

(Continued)

FOREIGN PATENT DOCUMENTS

TW 201040307 A 11/2010

*Primary Examiner* — Jaehwan Oh
(74) *Attorney, Agent, or Firm* — Haynes and Boone, LLP

(57) ABSTRACT

The present disclosure provides a semiconductor processing apparatus according to one embodiment. The semiconductor processing apparatus includes a chamber; a base station located in the chamber for supporting a semiconductor substrate; a preheating assembly surrounding the base station; a first heating element fixed relative to the base station and configured to direct heat to the semiconductor substrate; and a second heating element moveable relative to the base station and operable to direct heat to a portion of the semiconductor substrate.

20 Claims, 14 Drawing Sheets

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2005/0255245 A1 | 11/2005 | Fanton et al. |
| 2013/0285116 A1 | 10/2013 | Lochtefeld et al. |
| 2018/0127877 A1 | 5/2018 | Shim et al. |
| 2019/0127851 A1 | 5/2019 | Lau et al. |
| 2022/0013376 A1* | 1/2022 | Lau ........................ B23K 26/12 |
| 2023/0238259 A1* | 7/2023 | Yoshida .............. H01L 21/2686 438/795 |

* cited by examiner

DEPOSITION EQUIPMENT WITH ADJUSTABLE TEMPERATURE SOURCE

PRIORITY DATA

This application claims priority to U.S. Provisional Patent Application No. 63/197,642, filed on Jun. 7, 2021, entitled "Deposition Equipment With Adjustable Temperature Source", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, in the fabrication of ICs, an epitaxial layer may be formed on a semiconductor wafer by a chemical vapor deposition process using a mixture of semiconductor source gases. The chemical vapor deposition is performed according to predetermined process parameters in order to ensure that the epitaxial feature formed by the subsequent process is consistent with the target design (e.g., having a specific dimension and a specific profile). As the scaling down continues and feature complexity increases, the desired precision control more and more hinges on the ability to precisely control the processing temperature on fine grains of the wafer. In that regard, it has become increasingly challenging to reach such precision with the existing designs of deposition instruments. Therefore, although conventional technologies have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
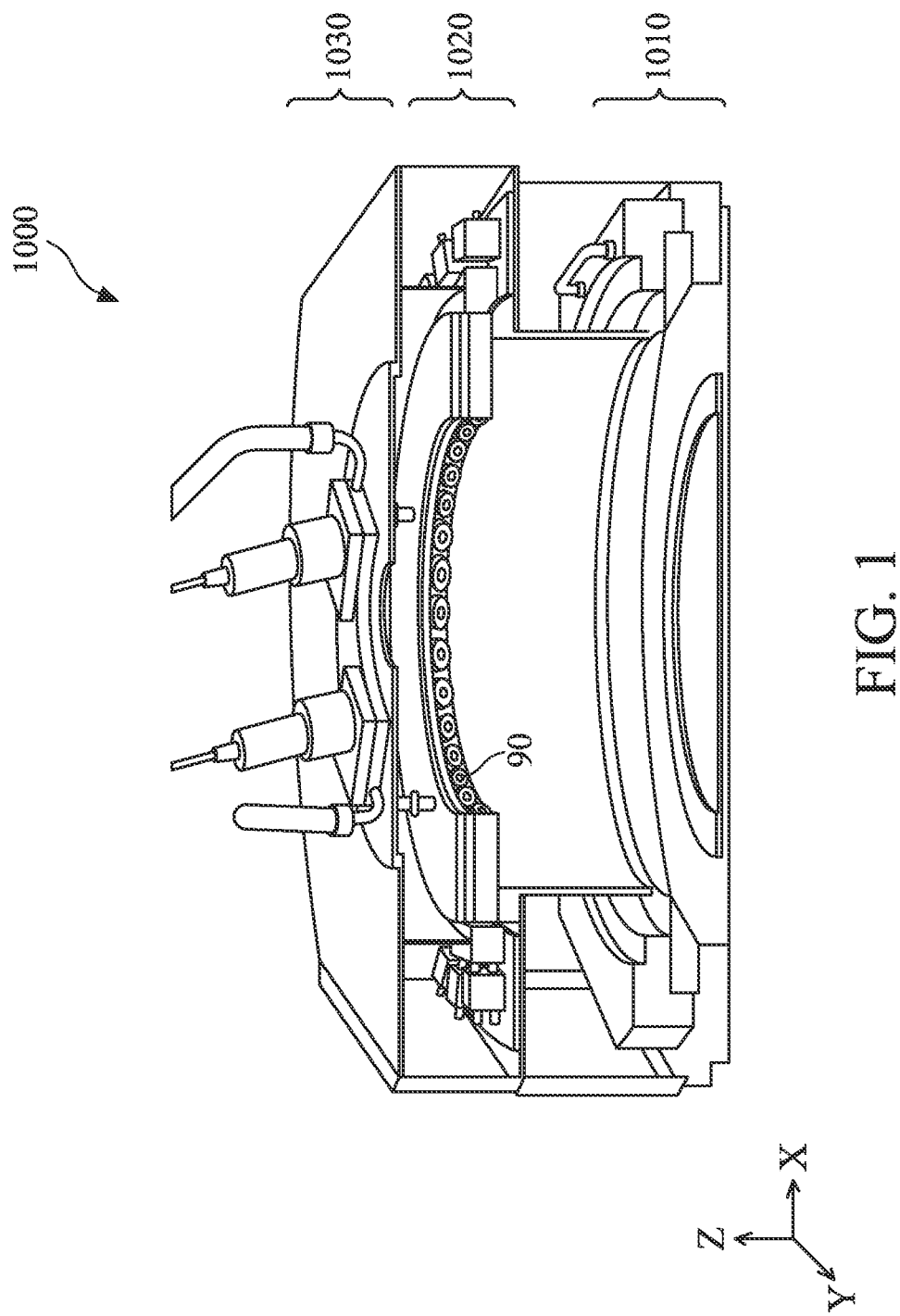
FIG. 1 is a three-dimensional (3D) cut-away view of an embodiment of a substrate processing apparatus according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/-10% of the number described or other values as understood by person skilled in the art. For example, the term "about 5 nm" may encompass the dimension range from 4.5 nm to 5.5 nm.

It should be noted that the embodiments discussed herein may not necessarily recite every component or feature that may be present within the structure. For example, one or more components may be omitted from the figures, e.g., while a discussion of the components may be sufficient to convey various implementations of the embodiments. Further, the method embodiments discussed herein may be discussed in a particular order of performance, while in other method embodiments, they may be performed in any reasonable order.

Embodiments of the present invention relate to a semiconductor device manufacturing apparatus and a method for processing the same, and more particularly, to a semiconductor manufacturing apparatus and a method for processing a semiconductor workpiece, such as a semiconductor substrate. In some embodiments, the semiconductor substrate includes a semiconductor wafer, such as a silicon wafer for example. In some examples, the substrate is a silicon substrate with a top surface having a (100) crystalline plane. The semiconductor substrate may include an elementary semiconductor such as silicon, germanium, and diamond. The semiconductor substrate may additionally or alternatively include a compound semiconductor such as silicon carbide, gallium arsenic, indium arsenide, and indium phosphide. The semiconductor substrate may include an alloy semiconductor such as silicon germanium, silicon germanium carbide, gallium arsenic phosphide, and gallium indium phosphide. The semiconductor substrate may include an epitaxial layer. For example, the substrate may have an epitaxial layer overlying a bulk semiconductor. Further, the semiconductor substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). In some embodiment, the semiconductor substrate includes multi-bridge-channel (MBC) transistors formed or to be formed thereon, the semiconductor substrate includes a stack of semiconductor material layers formed thereon. For example, the stack of semiconductor material layers includes silicon layers and silicon germanium layers alternatively formed and alternatively stacked thereon. Furthermore, the semiconductor substrate may include a semiconductor-on-insulator (SOI) structure. For examples, the substrate may include a buried oxide (BOX) layer formed by a process such as separation by implanted oxygen (SIMOX). The semiconductor substrate may include a p-type doped region and/or an n-type doped region. All doping may be implemented by a process such as ion implantation.

In the fabrication of integrated circuits, an epitaxial layer may be formed on a semiconductor substrate by a deposition process (for example, a chemical vapor deposition process, a physical vapor deposition process, an atomic layer deposition process, etc.) using a mixture of semiconductor source gases. The deposition process is performed according to a predetermined process parameter in order to ensure that the epitaxial features formed by the subsequent process is consistent with the target design (e.g., having a specific width and a specific height). The process parameters include the processing time, the type of the processing gas, the temperature of the processing chamber, the pressure of the processing chamber, and the like. As the scaling down continues and feature complexity increases, the desired precision control over feature dimensions and/or profiles more and more hinges on the ability to precisely control the processing temperature on fine grains on the substrate. In that regard, it has become increasingly challenging to reach such precision in temperature control with the existing designs of deposition instruments. Moreover, maintaining feature uniformity has also become ever more challenging. For example, epitaxial features formed at the edge of the substrate may have reduced dimensions, a defect known as roll-off profile. Such defects have been shown to lead to increased OFF current, emergence of short channel situations, and/or otherwise degraded device characteristics. In that regard, the present disclosure provides movable heating sources capable of directing heating energy at a particular fine region of the substrate, thereby providing localized heating and/or adjust for otherwise non-uniform heating. Such localized heating enables improved heating precision not available in existing instrument designs, thereby providing improved fabrication capability. Additionally, although deposition operation is used as an example application in the disclosure below, embodiments of the present disclosure may also be applied in various other operations that similarly require temperature uniformity and/or heating precision.

FIG. 1 is a three-dimensional (3D) cut-away view of a semiconductor processing apparatus 1000. FIG. 1 illustrates a portion of the semiconductor processing apparatus behind an imaginary vertical plane cutting through the processing apparatus through its transverse axis (described below). As illustrated in FIG. 1, the processing apparatus includes a layered setup. For example, a substrate level 1010 is provided at a lower region of the apparatus; a first heating element level 1020 is provided above the substrate level 1010, and a second heating element level 1030 is provided above the first heating element level 1020. Additional layers (e.g. additional heating element levels) may be present and omitted from FIG. 1 for simplicity. For example, another heating element level (not shown) may be positioned below the substrate level 1010 thereby providing heating to a bottom surface of the substrate positioned on the substrate level 1010. These levels are described in more detail below.

Figure 2:
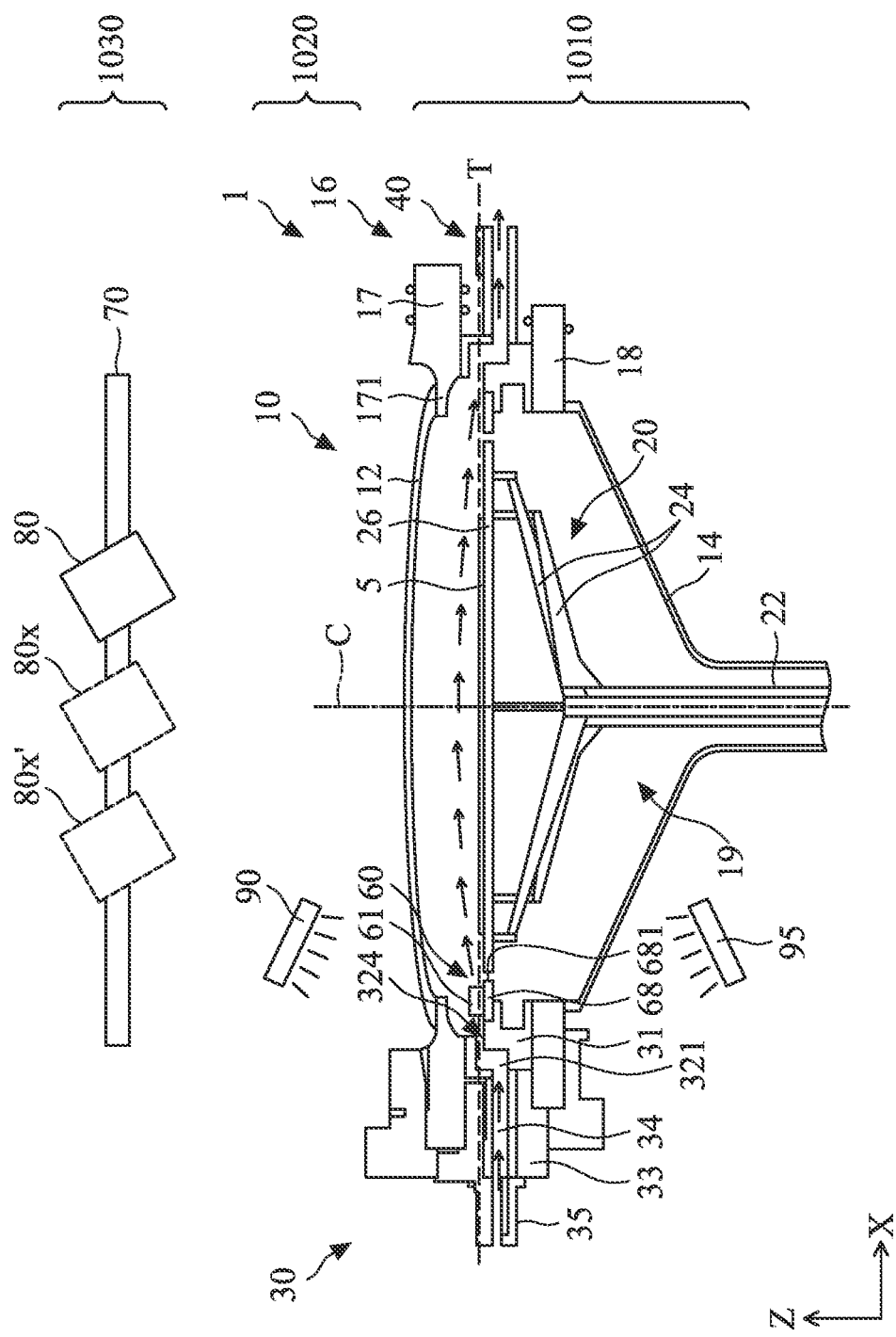
FIG. 2 is a cross-sectional side view of a substrate processing apparatus, or portions thereof, according to some embodiments of the disclosure.
Figure 3:
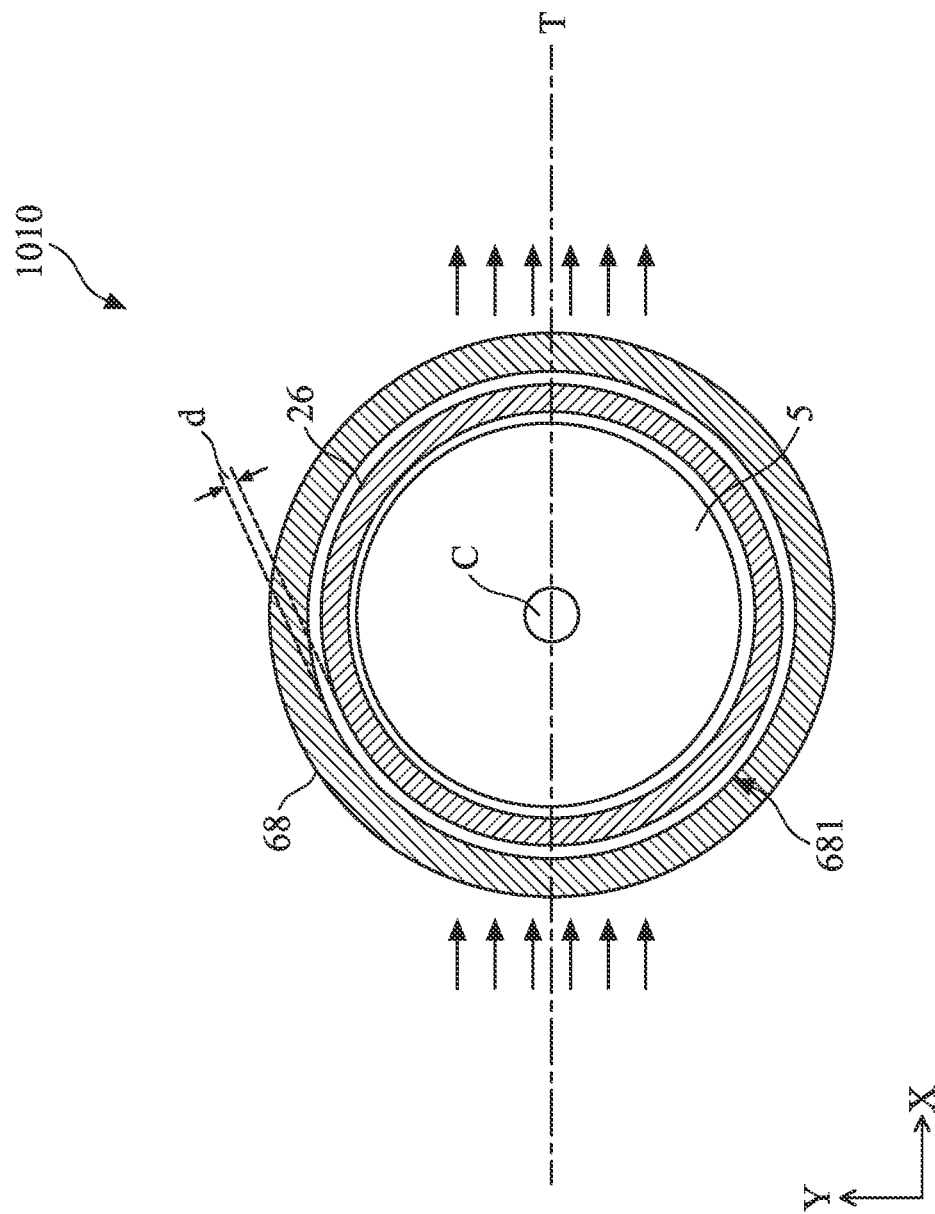
FIGS. 3 and 4 are cross-sectional top views of a substrate processing apparatus, or portions thereof, according to some embodiments of the present disclosure.

The various levels 1010, 1020, and 1030 are now described in detail with respect to FIGS. 2 and 3. FIG. 2 is a cross-sectional view of the semiconductor processing apparatus 1000 (or simply apparatus 1000). In some embodiments, the apparatus 1000 may be used to deposit an epitaxial layer on a semiconductor substrate 5, thereby forming epitaxial features (e.g. epitaxial source/drain feature). FIG. 3 is a top view of the substrate level 1010 of the apparatus 1000 according to some embodiments of the present invention. In some embodiments, a substrate level 1010 of the apparatus 1000 includes a housing 10, a susceptor 20, a fluid discharge module 30, a fluid removal assembly 40, and a preheating assembly 60. The number of components of the apparatus 1000 can be increased or decreased as required, and is not limited to this embodiment. In addition, the apparatus 1000 can be applied to other semiconductor processes, such as any semiconductor process that uses chemical gases to deposit semiconductor materials on the semiconductor substrate 5, besides depositing an epitaxial layer.

The housing 10 includes an upper portion 12, a lower portion 14 and a side portion 16. The upper portion 12, the lower portion 14 and the side portions 16 define a cavity 19 (or chamber 19) within the housing 10. In some embodiments, the cavity 19 may receive one or more semiconductor substrates 5 having a diameter of 250 mm or greater. In some embodiments, the upper portion 12 and the lower portion 14 are made of a material that has relatively high structural strength and is chemically stable during processing. In some embodiments, the upper portion 12 and the lower portion 14 are transparent or include transparent window(s) to allow light (visible or infrared) from a lamp to pass through. In some embodiments, the upper portion 12 and the lower portion 14 are made of transparent quartz. In some embodiments, the side portion 16 includes an upper clamping element 17 and a lower clamping element 18. The upper and lower clamping elements 17 and 18 are combined together, e.g., locked, by suitable means to secure the fluid discharge module 30 and the fluid removal assembly 40. In some embodiments, the upper portion 12 is secured to a flange 171 of the upper clamping element 17. The flange 171 is spaced a sufficient distance from the preheating assembly 60.

The susceptor 20 includes a shaft 22, a plurality of brackets 24 and a base 26. The lower end of the bracket 24 is coupled to the rotary shaft 22, and the upper end of the bracket 24 is coupled to the bottom surface of the base 26. Thus, the base 26 is horizontally fixed to the upper end of the bracket 24, and the semiconductor substrate 5 is supported thereby. In some embodiments, the susceptor 20 is coupled to a variable speed motor (not shown) via a shaft 22 to rotate about a rotation axis C. The fluid discharge module 30 and the fluid removal assembly 40 are disposed along a transverse axis T on either side of the susceptor 20 to provide an air flow along the upper surface of the base 26. The transverse axis T passes through the rotation axis C of the base 26. In some embodiments, the fluid discharge module 30 and the fluid removal assembly 40 are disposed on opposite sides of the susceptor 20. A process gas, such as a silicon source gas, from the fluid discharge module 30 flows over the upper surface of the base 26 and is exhausted through the fluid removal assembly 40, as indicated by the arrows in FIGS. 2 and 3. In some embodiments, the fluid discharge module 30 is fluidly coupled to a gas supply module. Process gas from the gas supply module is provided to the semiconductor substrate 5 via the fluid discharge module 30. In some embodiments, the gas supply module includes a plurality of gas sources and a plurality of fluid control units. The fluid discharge module 30 includes a discharge connector assembly 35 fluidly connected to the gas sources via the fluid control units, where the fluid control units control the flow rate of the process gas provided to the fluid discharge module 30. In some embodiments, the fluid discharge module 30 further includes a fluid discharge assembly 31. The fluid discharge assembly 31 has a side surface, and the side surface is arranged adjacent to the preheating assembly 60. The side surface may be a curved surface and extends along the circumferential direction of the semiconductor substrate 5 with the transverse axis T as the center. The side surface may be a continuous curved surface or a multi-segment curved surface. The fluid discharge assembly 31 may include one or more discharge channels 321 configured to allow fluid from the fluid discharge module 30 to be discharged to the semiconductor substrate 5. In some embodiments, the discharge channels 321 fluidly connect to the opening 324 formed on the side surface of the fluid discharge assembly 31. Through the fluid discharge assembly 31, the process gas may pass through a large area of the semiconductor substrate 5 to deposit a silicon thin film on the semiconductor substrate 5.

The first heating element level 1020 includes a plurality of heating elements 90. The heating elements 90 may be lamp modules fixed on the apparatus 1000 at a level above the substrate level 1010. In the fabrication process, heating elements 90 may emit light to heat certain regions of the substrate 5. In some embodiments, a subset of the heating elements 90 may be configured to direct light, and therefore heat, to an inner zone of the substrate 5 from above the substrate 5. For example, the light of the heating elements 90 may be configured to be directed to a curved portion of a top dome that reflects the light and heat onto the inner zones of the substrate 5. Meanwhile, another subset of the heating elements 90 may be configured to direct light, and therefore heat, to an outer zone of the substrate 5, also from above the substrate 5. For example, the light of the heating elements 90 may be configured to be directed to a flat portion of the top dome. In some embodiments, the first heating element level 1020 is only a portion of a fixed heating system implemented on the semiconductor processing apparatus 1000. For example, another plurality of heating elements, represented by the heating elements 95, may be provided below the substrate level 1010. In some embodiments, a subset of the heating elements 95 may be configured to direct light and therefore heat to an inner zone of the substrate 5 from below the substrate 5, while another subset of the heating elements 95 may be configured to direct light, and therefore heat, to an outer zone of the substrate 5 from below the substrate 5. In some embodiments, the heating elements 95 may be the same as or similar to the heating elements 90, and collectively form a heating cavity surrounding the substrate 5. The heating elements 90 and 95 may remain still during the manufacturing process performed on substrate, while substrate 5 rotates. In some embodiments, the first heating elements level 1020 (and any additional heating levels, e.g. below the substrate level 1010, represented by the heating elements 95) may be configured to be symmetrically arranged across the imaginary vertical plane cutting through the transverse axis T. In other words, the portion not shown on FIG. 1 may be configured to be approximately the mirror image of the portion illustrated on FIG. 1. For example, FIG. 1 illustrates sixteen heating elements on the first heating elements level 1020. In some embodiments, another sixteen heating elements, similar to those shown, are present in the portion not illustrated on FIG. 1.

As described above, the heating elements 90 and 95 may direct heating energy to certain zones on the substrate 5. As scaling down continues and features become ever more miniaturized, such zones often encompass many device features that require different levels of heating treatment. The heating elements 90 and 95 alone may not be capable of providing such differentiated heating treatment. Moreover, in some embodiments, features on edges of the substrate may be subject to different heating environment, which cause such features to have unintended different dimensions or profiles. For example, source/drain features (e.g. source/drain features of silicon germanium) on the edge of the substrate may possess smaller volume due to the nonuniformity of heating as compared to those on the inner regions of the substrate 5.

The preheating assembly 60 is disposed outside in the circumferential direction of the susceptor 20. The process gas from the fluid discharge module 30 is sequentially exhausted through the preheating assembly 60 on the left side of the drawing (FIGS. 2 and 3), the semiconductor substrate 5, and the preheating assembly 60 on the right side of the drawing via the fluid removal assembly 40. Accordingly, the process gas may be pre-heated as it passes through the preheating assembly 60 and before reaching the substrate 5. In some embodiments, the preheating assembly 60 absorbs heat energy from the heating elements 90, 95. In some embodiments, the preheating assembly 60 includes a support 68. The support 68 may be fabricated from an opaque material (e.g., silicon carbide, graphite coated with silicon carbide, and/or the like) and may be coated with silicon carbide to prevent erosion by the process gases. The support 68 may be closed annular and surround the base 26. It should be understood, however, that the embodiments of the present invention are capable of numerous forms and modifications. In other embodiments, the support 68 is an arch with an arch angle of approximately 360 degrees, and a gap is formed between two ends of the arch to prevent the support 68 from being deformed due to thermal stress accumulation after thermal expansion.

Figure 4:
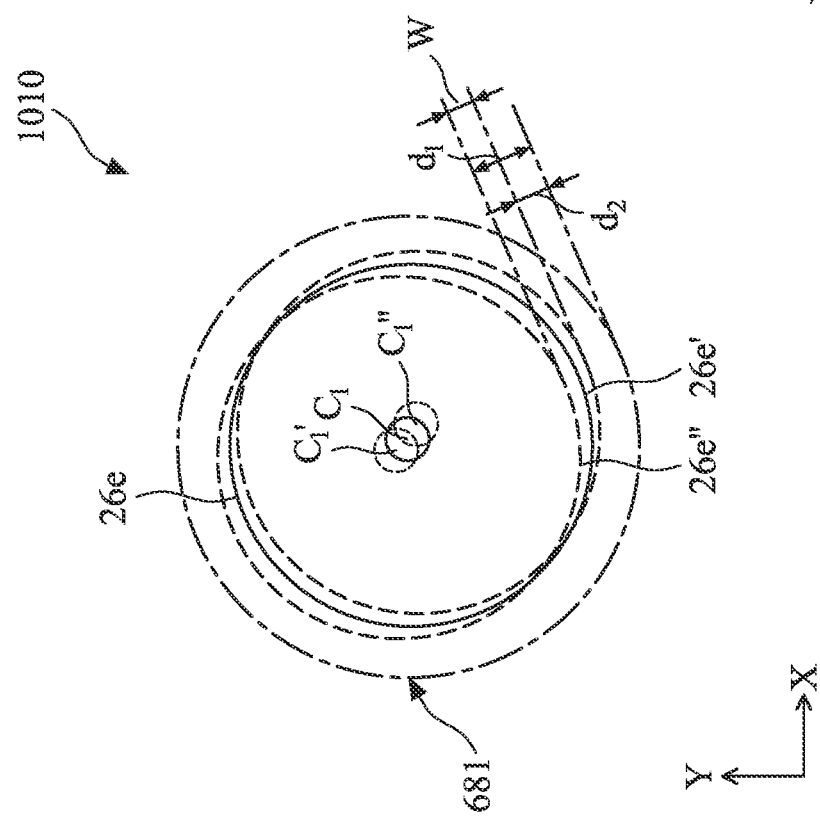

The support 68 has an inner edge 681. In some embodiments, the inner edge 681 and the outer edge of the base 26 are formed with a gap therebetween in the circumferential direction of the base 26 to allow the base 26 to rotate. In some embodiments, the distance between the inner edge 681 and the outer edge of the base 26 at a certain location may be the distance d. In some embodiments, the distance d is configured to be at least 1.5 mm. If the distance d is too small, the susceptor 20 may hit the preheating assembly 60 during rotation. In some embodiments, the susceptor 20 and the preheating assembly 60 are configured to be exactly concentric. For example, the inner edge 681 may have a circular profile that have its center falling exactly on the axis C. Accordingly, in such a situation, as the susceptor 20 rotates around the axis C, the distance d between the preheating assembly 60 (e.g. the inner edge 681) and the susceptor 20 (e.g. the outer edge of the base 26) does not change. In some other situations, however, exact concentric configuration may not be achievable. For example, referring to FIG. 4, the inner edge 681 may have a center $C_1$ that is offset from the C axis of the base 26. Accordingly, as the susceptor 20 rotates, the center $C_1$ of the susceptor 20 may move across the axis C and transit between two extreme positions $C_1'$ and $C_1''$. In some embodiments, this transiting movement of the center $C_1$ may be referred to as the wobbling of the susceptor 20. The extent of wobbling may be measured from the maximum change in distance d at certain location of the base 26 and between two extreme positions 26e' and 26e''. The extent of wobbling is referred to as the wobbling distance W. In other words, as illustrated in FIG. 4, W equals to a change in the distance d between the change in distance between the inner edge 681 and the outer edge of the base 26. That is, $W=d_1-d_2$. In some embodiments, W is designed to be less than about 0.3 mm. If W is greater than about 0.3 mm, the base 26 may hit the preheating assembly 60 during its rotation, and cause hardware damages.

In some embodiments, the relative position of a certain feature on the substrate 5 relative to the preheating assembly 60 as well as the heating elements 90, 95 determines the heating profile that feature experiences during the fabrication process. The wobbling motion of the susceptor 20 causes movements of the susceptor 20 relative to the preheating assembly 60, thereby introducing heating variation and instability to that feature. While such heating variation and instability may be minor when the feature has a substantially greater size than the wobbling distance W, they may become intolerable when the feature size is comparable to such wobbling distance W. Therefore, as the advanced technology nodes continue to scale down, the effect of wobbling has become more and more evident and critical. In some embodiments, such wobbling variation may be addressed and compensated using additional heating sources in the second heating elements level 1030 that compensate for the heating variations due to the wobbling motions.

Figure 5:
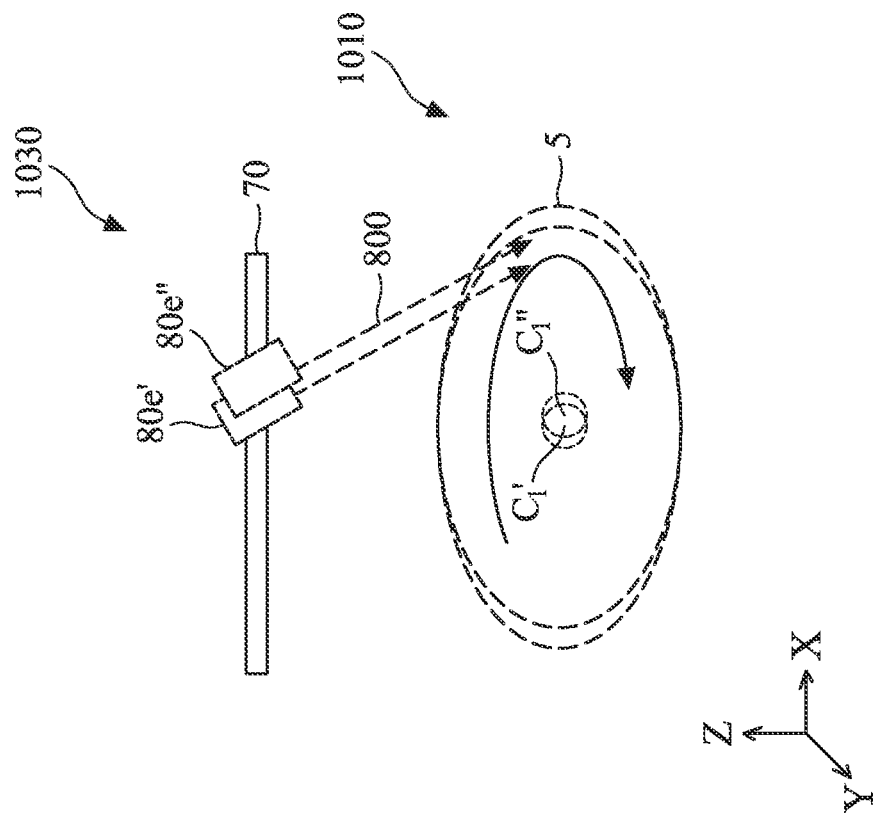
FIGS. 5, 6, 7, and 8 are schematic views of a substrate processing apparatus, or portions thereof, according to some embodiments of the disclosure.
Figure 6:
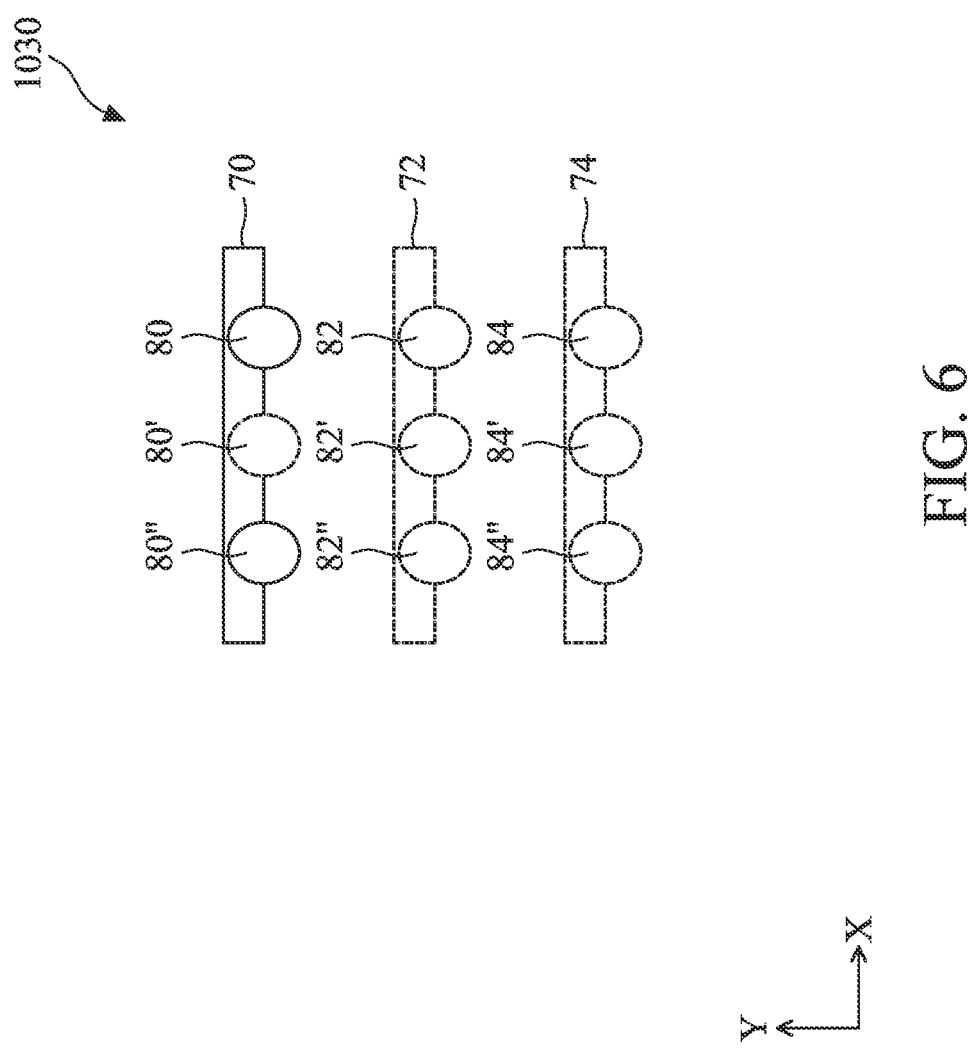

Referring to FIGS. 1, 2, and further to FIGS. 5 and 6, the apparatus 1000 includes a second heating element level 1030. The second heating elements level 1030 may be positioned above the first heating elements level 1020 and directly above the substrate 5. In some embodiments, the second heating element level 1030 may include a plurality of heating sources 80. In some embodiments, the heating sources 80 may be laser heating elements. In some embodiments, there may be about 1 to about 20 laser heating elements 80 on the second heating element level 1030. In some embodiments, heating provided by the laser heating elements 80 are implemented to provide localized heating in a certain fabrication step, without interaction or collaboration from the heating elements 90, 95. In some embodiments, heating provided by the laser heating elements 80 may be configured based on the heating variation and instability due to the wobbling motions, thereby compensating such variations and instability. Accordingly, each feature receives more stable and predictable heating experiences. Moreover, in some embodiments, the heating provided by the laser heating elements 80 may further be configured to compensate for lack of heating uniformity provided by the heating elements 90, 95. As described above, it is often challenging to provide uniform heating to all regions of the substrate 5 with the heating elements 90, 95 alone. For example, epitaxial features on edges of the substrate 5 may be subject to less heating due to their unique position on the substrate 5. In approaches not implementing the laser heating elements 80, these epitaxial features may grow to a lesser extent than designed such that they may have a smaller volume. Here, the laser heating elements 80 may be configured to direct the laser heating energy on those affected edge epitaxial features to provide the amount of heating energy corresponding to the difference in the heating amount at those edge locations alone, as compared to those on the inner portions of the substrates 5. Accordingly, the features at the edge locations on the substrate 5 may receive an amount of heating that matches those on the inner portions of the substrate 5. In other words, all relevant regions of the substrate 5 may uniformly receive the same amount of heating, regardless of their exact location. Feature uniformity (e.g. the size of the epitaxial features) may be substantially improved.

In some embodiments, the laser heating elements 80 may be configured to heat a small target area on the substrate 5, without substantially heating or affecting areas surrounding the target area. In some embodiments, the size of the affected target area may be controlled by adjusting the size of laser beam, such that areas outside the circumferences of the laser beam is not affected. For example, the laser heating elements 80 may be controlled to have a beam diameter of about 0.5 mm to 25 mm. In some embodiments, the beam diameter may be about 10 mm to about 18 mm. If the beam diameter is too small, the process time may be excessively long; conversely, if the beam diameter is too large, the heating accuracy may be too low to be sufficiently productive. Accordingly, features outside that specifically illuminated target area are not subject to the laser heating, but rather experience only the heating from the heating elements 90, 95, if any. In some embodiments, the laser heating elements 80 may be configured to provide a laser beam of a unique wavelength, absorbable only by the material of a specific target feature. Accordingly, features of different materials will not be heated, whether or not they fall within the illuminated target area by the laser beam. In some embodiments, the target feature may include silicon germanium (SiGe) the laser wavelength may be about 800 nm to about 1000 nm. In some embodiments, the laser wavelength may be about 900 nm to about 950 nm. If the laser wavelengths are too long or too short, the laser energy may not be effectively absorbed by the target feature. However, in some embodiments, the target material may be different than SiGe, and the laser wavelength may be adjusted to provide the optimal absorption of the laser heating power. In other words, by adjusting the laser beam size and the wavelength, specific areas of miniaturized size may be selectively heated. In some embodiments, the laser heating elements 80 provide photon energy. Photon energy is the energy carried by photons. The amount of energy is directly proportional to the photon's electromagnetic frequency and thus, equivalently, is inversely proportional to the wavelength. The higher the photon's frequency, the higher its energy. Photo energy is distinct from other sources of energy, such as energy carried by high-speed electrons. For example, photon energy is not ionized, and the implementation of laser heating elements does not change oxidation states of the material it interacts with. By contrast, high-speed electrons, such as those from an e-beam source may interact with the target material and causing chemical changes (e.g. oxidation state changes) or physical changes (e.g. removing a portion of the target materials bombarded by the electrons).

Referring to FIGS. 4 and 5, in some embodiments, the laser heating elements 80 may be mounted on a slide 70 above the first heating elements level 1020. In some embodiments, the slide 70 may be configured to be fixed relative to the structural support of the apparatus and extends along the x-direction. Here, x-axis is a horizontal axis parallel to the top surface of the susceptor 20; the y-axis is another horizontal axis parallel to the top surface of the susceptor 20 and orthogonal to the x-axis; and the z-axis is orthogonal to the plane defined by the x-axis and the y-axis. In some embodiments, the laser heating elements 80 may be slidably mounted on the slide 70. In other words, the laser heating elements 80 may make sliding motions along the slide 70, thereby along the x-axis by the functioning of a motion motor. For example, the laser heating element 80 may slide to position 80x, 80x', or other locations along the slide 70. In some embodiments, the laser heating elements 80 are configured to direct light and heating vertically (e.g. along the z-axis) onto the substrate 5. Accordingly, the movable range of the laser heating elements 80 on the slide 70 may be configured to span the entire lateral distance along the x-direction that projects vertically onto the diameter dimension of the substrate 5. Moreover, in some embodiments, the movable range of the laser heating elements 80 on the slide 70 may be configured to be symmetrically arranged on both side of a center point which vertically maps onto the rotation center axis C along the z-direction. Therefore, in some embodiments, the movable range of the laser heating elements 80 may be greater than the diameter dimension of the substrate 5. In some embodiments, in order to potentially accommodate substrates 5 of different sizes, the movable range of the slide 70 may be configured to be about 300 mm to about 500 mm. For example, the movable range of the slide may be configured to be about +/−150 mm to about +/−250 mm relative to the axis C. In some embodiments, as described in more detail below, the laser heating elements 80 may be configured to be rotatable along a horizontal axis (e.g. y-axis). Such rotations enable the laser heating elements 80 to direct light and heating at an angle relative to the z-axis. When such a rotation is configured to be in the directions of both clockwise and counterclockwise, the range the laser heating elements 80 can illuminate may exceed the movable range itself. Accordingly, in such embodiments, the movable range of the laser heating elements 80 may be less than the diameter dimension of the substrate 5.

In some embodiments, the slide 70 may be configured to be vertically aligned with the transverse axis T. In other words, a projection of the slide 70 along the z-direction onto the base 26 passes through the center axis C. Such a configuration ensures that all areas of the substrate 5 may be targeted by the laser heating elements 80, regardless whether it is configured to be rotatable along the y-axis or not. In some other embodiments, however, the slide 70 may be configured to be vertically offset from the transverse axis T. In such other embodiments, when the laser heating elements 80 are configured to be rotatable along the y-axis (and the laser beam to be confined within the xz plane), certain inner portions of the substrate 5 may not be reached by the laser heating elements 80. In some instances, the laser heating elements 80 may be configured to be rotatable along an axis that is not y-axis. For example, the laser heating elements 80 may be configured to be rotatable along the x-axis. Accordingly, even when the slide 70 is vertically offset from the transverse axis T, all regions of the substrate 5 may still be targeted by the laser heating elements 80 by adjusting its x-axis location, as well as the rotation angle around the x-axis.

In some embodiment, the sliding operation may be automated with the motion motor. The motion motor may drive the laser heating element 80 to direct heating on an edge region of the substrate 5, or drive the laser heating elements 80 to direct heating on an inner region of the substrate 5. In some embodiments, the laser heating element 80 may move along the slide 70 as the substrate 5 rotates along the C axis. Accordingly, regions on the substrate 5 having a same distance from the center axis C theoretically experiences the same heating history. However, as explained earlier, the wobbling motion of the base 26 may cause the illustrated region to similarly wobble on the substrate 5, thereby resulting in variations in the heating. For example, the wobbling motion may cause the distance between the target region and the laser heating elements 80 to vary during the movements. As a result, the spot size of the laser beam varies, and power accuracy varies. These variations lead to heating instability and inaccuracy. In some embodiments, the laser heating elements 80 may be configured to move along the x-axis by a distance calculated based on the wobbling distance W during the process. For example, the laser heating element 80 may shuttle between two extreme positions 80e' and 80e". In some embodiments, the distance $\delta_x$ between the two extreme positions 80e' and 80e" is correlated with the wobbling distance W. For example, $\delta_x$ may be calculated using equation (I)

$$\delta_x = c_x \cdot W \quad (I)$$

where $c_x$ is a coefficient associated with the mechanism of the rotation of the support 68 including various factors, such as variation of the distance d and the angular of the rotation axis. The coefficient $c_x$ can be determined by manufacture data extracted from the supporter 68, such as experimental thermal nonuniformity data of the substrates processed by the supporter 68 compared with the calculated thermal nonuniformity using the equation (I). Moreover, in some embodiments, the frequency $\varphi_x$ of the shuttling of the laser heating element 80 may be correlated with the rotation speed R of the substrate 5. For example, the frequency $\varphi_x$ may be calculated using equation (II)

$$\varphi_x = p_x R \quad (II)$$

where $p_x$ is a coefficient. When the rotation speed R is lower (or higher), the frequency $\varphi_x$ needs to be slower (or higher) so that the laser heating element 80 can shuttle a certain number of the shuttle cycles to eliminate the wobbling effect and achieve uniform thermal effect. The number of the shuttle cycles and accordingly the coefficient $p_x$ can be determined by the manufacturing data. For examples, the device performances and the coefficient $p_x$ from historical manufacturing data are compared to determine the value or range of the coefficient $p_x$ so that the shuttle effect is optimized. In other words, the laser heating elements 80 may be configured to follow the wobbling motion. In some embodiments, implementing such sliding laser heating elements 80 enables better maintenance of power accuracy and spot size of the illuminated area, thereby providing more uniform thermal distribution to the target features on the substrates 5.

In some embodiments, plurality of laser heating elements 80, 80', 80" may be mounted on the slide 70 to improve the ability to control the heating. For example, a single laser heating element 80 may not have sufficient power to compensate the heating discrepancy between the edge portion and the inner portions of the substrate. Having multiple laser heating elements provide cumulative power that addresses the insufficiency in the laser power. In such examples, the multiple laser heating elements may be each directed towards a same target region. For another example related to compensating for the wobbling variations, the shuttling speed of the laser heating elements may not be sufficient large when either the wobbling distance W is too large, or when the rotation speed R is too large. In such examples, multiple laser heating elements 80, 80', and 80" may be configured to collaborate with each other, for example, each shuttling a reduced distance (e.g. ⅓ $\delta_x$) as compared to the entire shuttling distance $\delta_x$. Accordingly, the ability for compensating such wobbling defects are improved. In some embodiments, the second heating elements level 1030 may include a plurality of slides 70, 72, and 74, each having multiple slidable laser heating elements mounted thereon. For example, the slide 72 may have laser heating elements 82, 82', 82" mounted thereon; and the slide 74 may have laser heating elements 84, 84', 84" mounted thereon. In some embodiments, the slides 70, 72, and 74 are configured to be parallel to each other and spaced apart from each other along the y-axis. In some embodiments, the slides 70, 72, and 74 are configured symmetrically across the transverse axis T. However, in some embodiments, the slides 70, 72, and 74 are configured to be asymmetric across the transverse axis T. The laser heating elements 80', 80", 82, 82', 82", 84, 84', 84" may be configured similarly to the laser heating elements 80 described above. The laser heating elements 80, 82, and 84 may be configured to direct the same amount or different amounts of heating to features that are arranged apart from each other along the y-direction.

Figure 7:
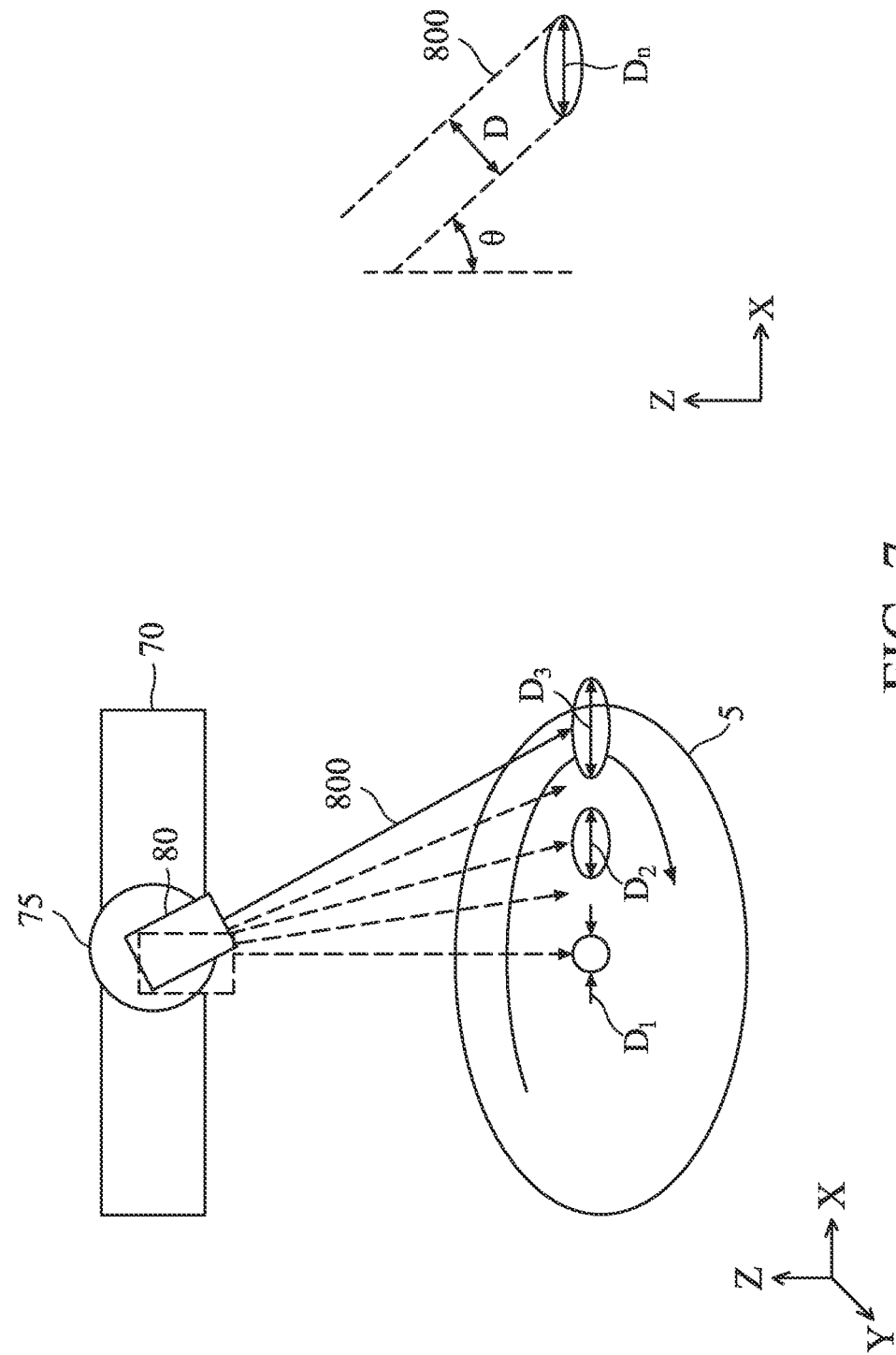

In some embodiments, the laser heating elements 80, 80', 80", 82, 82', 82", 84, 84', 84" (collectively referred to as the laser heating elements 80) may be further configured to provide adjustable sizes to the target area it illuminates. Referring to FIG. 7, the laser heating elements 80 are mounted on a holder 75 attached to the slide 70. In the depicted embodiments, the laser heating elements 80 may be configured to be rotatable along the y-axis going through the holder 75, such that it can generate laser beams 800 along variable directions in the xz plane by rotating the laser heating elements 80 along the y axis. Alternatively, as described above, in some embodiments, for example when the slide is configured to be vertically offset from the transverse axis T, the laser heating elements 80 may be instead configured to be rotatable along the x-axis. Regardless the rotation axis, in some embodiments, the rotation of the laser heating element 80 may be in a range of +/−90° relative to the vertical axis z while facing the substrate 5. In some embodiments, the laser heating source 80 may rotate counterclockwise, clockwise, or both. Although laser beams 800 may be depicted as a single straight line, they have finite sizes. In some embodiments, the laser beam 800 may be collimated and have substantially negligible divergence. Accordingly, the laser beam 800 illuminates a region of a constant size S (e.g. having a diameter of D) on a plane perpendicular to the direction along which it propagates, regardless how far away the plane is from the laser heating elements 80. Meanwhile, the illuminated region on planes that are not perpendicular to the direction along which the laser beam 800 propagates may have varying sizes that are greater than S. For example, as illustrated in FIG. 7, the laser beam 800 may have a diameter D on a plane perpendicular to its propagation direction. But the illuminated area on the substrate 5 may have a size greater than the S. The illuminated area on the substrate 5 may have a size $S_n$ and a diameter of $D_n$, where n may be 1, 2, 3, etc. In some embodiments, the size $S_n$ and the diameter $D_n$ of the illuminated region on the substrate 5 may be calculated based on equations (III) and (IV) below:

$$D_n = D/\cos\theta \qquad \text{(III)}$$

$$S_n = S/\cos^2\theta \qquad \text{(IV)}$$

where θ is the angle between the vertical direction z and the direction along which the laser beam 800 propagates. As described above, the angle θ may be about +/−90° relative to the vertical axis z while facing the substrate 5. In some embodiments, the laser heating elements 80 rotates (e.g. the angle θ is adjusted) to obtain an illumination area of the desired size, before further moving along other dimensions. Although not explicitly depicted, in some embodiments, the spot size may be further modulated and adjusted by implementing lenses.

In some embodiments, the changing of the size $S_n$ may also change the illumination power received on the target area. Accordingly, in some embodiments, the output power of the laser source may be adjusted to compensate such changes in the received power, for example, by adjusting the electric current provided to the laser heating elements 80. In some embodiments, the adjusting of the laser output power may be between about 10 W to about 120 W. If the laser power is too low, such as less than about 10 W, the heating efficacy may be too low to realize the benefits described here. If the laser power is too high, the equipment may be subject to damages. In some embodiments, the adjustment of laser output power may further be based on targeted substrate thicknesses. For example, in some embodiments, by increasing the laser output power from about 10 W to about 120 W, the overall thickness of the substrate may increase from about 1 nm to about 100 nm.

Figure 8:
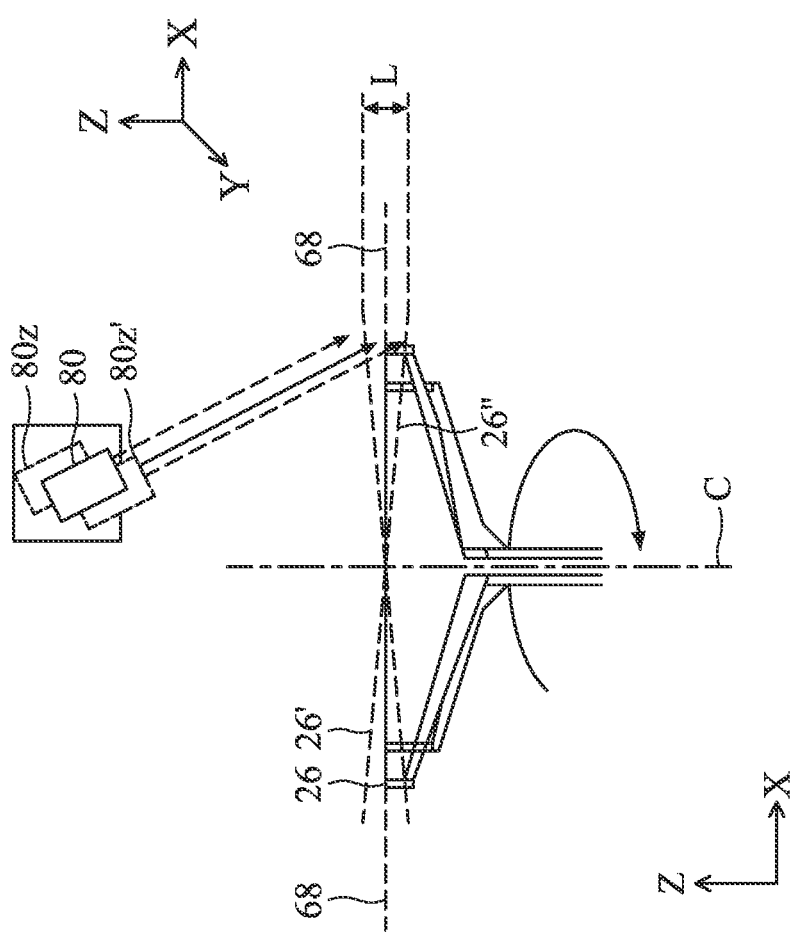

In some embodiments, the base 26 of the susceptor 20 is configured to be leveled (or coplanar) with the top surface of the support 68 of the preheating assembly 60. In such a situation, as the susceptor 20 rotates around the axis C, all points on the base 26 stay in the same plane as the top surface of the support 68. In other words, the distance along the z-direction between the base 26 and the heating elements 90, 95 remain constant throughout the rotation motion. However, exact coplanar configuration may not be achievable. For example, referring to FIG. 8, the base 26 of the susceptor 20 may be tilted slightly at an angle relative to the top surface of the support 68 of the preheating assembly 60. The extent of tilting (or conversely, the extent of coplanarity) is referred to as leveling of the base 26. Accordingly, as the susceptor 20 rotates, the base 26 may vibrate between two extreme positions 26' and 26". Such vibration is also referred to as the leveling motion. Here, the extreme positions are the position where the base 26 deviates from its ideal position the farthest in the z-direction. The separation between the two extreme edge locations of the base 26 along the z-direction is defined as the leveling range L. In some embodiments, the leveling range L is configured to be less than about 0.3 mm. If the leveling range is too large, such as greater than about 0.3 mm, the lift pin may be damaged during operation. When the leveling range is not zero, each point of the substrate 5 may have a varying distance from the heating elements 90, 95 during each rotation motion. Such varying distance may degrade the control of heating treatment. Moreover, different points of the substrate 5 also receive varied heating exposure, sometimes unintendedly, due to the leveling issue. Such variations further degrade uniformity of features that otherwise should have identical profiles and dimensions. In some alternative embodiments, the top surface of the support 68 may not be coplanar with the base 26 but slightly higher than the upper surface of the base 26. In such alternative embodiments, similar leveling issue may be present when the base 26 is not exactly parallel to the top surface of the support 68.

In some embodiments, the leveling issue is addressed with the second heating elements level 1030. For example, the laser heating elements 80 on the second heating elements level 1030 may be configured to be height adjustable. For example, the laser heating elements 80 (or the slide 70) may be attached to a motion motor capable to moving along the z-direction. In the depicted embodiments of FIG. 8, the laser heating sources 80 may be adjusted along the z-direction between two extreme positions 80z' and 80z". In some embodiments, these two extreme positions each address the corresponding deviated extreme position 26' and 26" of the base 26 from its ideal position. For example, the laser heating elements 80 may be configured to move along the z-axis by a distance calculated based on the leveling range L during the process. For example, the distance $\delta_z$ between the two extreme positions 80z' and 80z" is correlated with the leveling range L. For example, $\delta_z$ may be calculated using equation (V)

$$\delta_z = c_z \cdot L \qquad (V)$$

where $c_z$ is a coefficient associated with the mechanism of the height variation of the laser heating elements 80 including various factors, such as height variation L. The coefficient $c_z$ can be determined by manufacture data extracted from the laser heating elements 80, such as experimental thermal nonuniformity data of the substrates processed by the laser heating elements 80 compared with the calculated thermal nonuniformity using the equation (I). Moreover, in some embodiments, the frequency $\varphi_z$ of the shuttling of the laser heating element 80 along the z-direction may be correlated with the rotation speed R of the substrate 5. For example, the frequency $\varphi_z$ may be calculated using equation (II)

$$\varphi_z = p_z / R \qquad (VI)$$

where $p_z$ is a coefficient associated with the number of the shuttle cycles and accordingly the coefficient $p_z$ can be determined by the manufacturing data. For examples, the device performances and the coefficient $p_z$ from historical manufacturing data are compared to determine the value or range of the coefficient $p_z$ so that the shuttle effect is optimized. In some embodiments, the frequency $\varphi_z$ and the coefficient $p_z$ may be equal to the frequency $\varphi_x$ and the coefficient $p_x$, respectively. In other words, the laser heating elements 80 are configured to follow the leveling motion along the z-axis. In some embodiments, implementing such vertically height-adjustable laser heating elements 80, better maintenance of power accuracy and spot size of the illuminated area are achieved. Accordingly, more uniform thermal distribution to the target features on the substrates 5 are realized.

Figure 9:
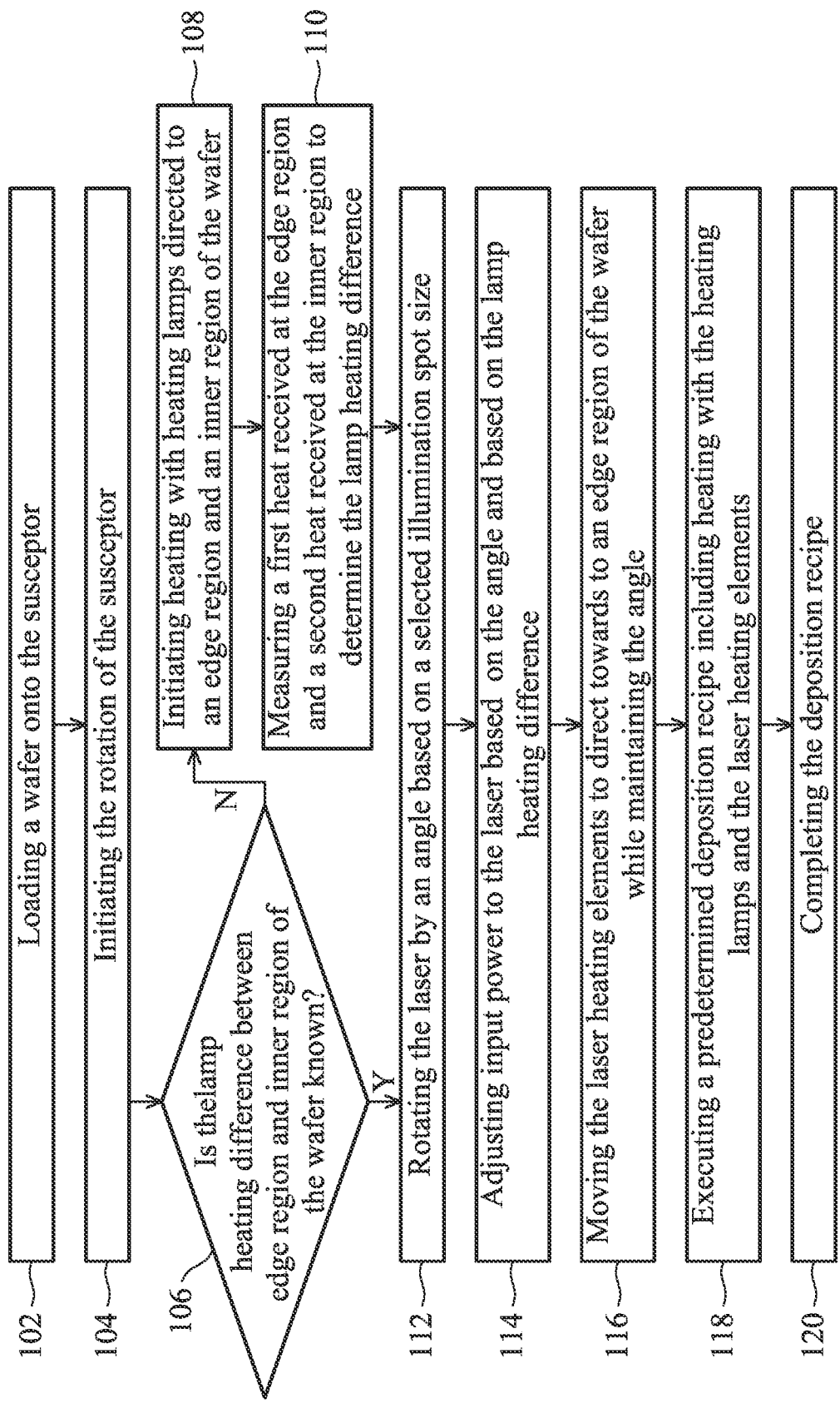
FIGS. 9 and 10 are flowcharts of methods of processing a substrate according to some embodiments of the disclosure.

In some embodiments, the laser heating elements 80 do not move or rotate during the process. Such embodiments may be referred to as the static-type embodiments of the present disclosure. All movements for the laser heating elements 80 are completed prior to the start of deposition recipe. FIG. 9 is a flow chart of a method 100 of processing a substrate 5 according to the static-type embodiments of the present disclosure. At step 102, the substrate 5 is loaded onto the base 26 of the susceptor 20 in the housing 10 of the apparatus 1000. At step 104, the proper recipe is selected. The recipe includes parameters such as the susceptor 20 rotation speed, temperature, chamber pressure, precursor Gas flow, carrier gas, blower speed, PID control, Dopant mixture ratio, power ratio, process time etc. Thereafter, the susceptor 20 rotation along the axis C is initiated. At the optional step 106, the method evaluates whether same heating target features are located in areas of the substrate 5 with heating intensity variations. For example, as described earlier, the heating intensity provided by the heating elements 90, 95 to target features in an edge region and target features in an inner portion of the substrate 5 may differ. If so, referring to step 108 of FIG. 9, heating from the heating elements 90, 95 are initiated. The heating levels (e.g. heating intensity) in the edge regions and the inner portions of the substrate 5 are each measured, using any suitable methods. For example, an infrared thermometer may be used to determine the heating levels in the edge regions and in the inner portions. A heating level difference is calculated between these two heating levels. In some embodiments, the heating level difference may have been known from a previous experiment, or in some embodiments, the target features may be located within the same regions of the substrate not subject to a heating level difference. In such embodiments, steps 108 and 110 may be omitted.

At step 112, the laser heating element 80 is rotated based on the desired spot size on the substrate 5. In some embodiments, the spot size may be determined based on the desired size of the region of the substrate to be heated by the laser heating elements 80. In some embodiments, a deposition operation may blanketly form an epitaxial layer. However, the edge regions and the inner portions of the substrate 5 may be subject to different level of heating from the heating elements alone. In such embodiments, the target feature may be the entire size of the epitaxial layer, and the spot size should cover that entire size. In some embodiments, a source/drain region of a transistor is located in the edge region of a substrate 5, and subject to lower heating level from heating elements 90, 95 than its counterparts in the inner portions of the substrate 5. Therefore, for the growth of source/drain features to receive the same amount of heating energy, thereby avoid nonuniformity issues, it may be desirable to heat that entire size corresponding to the source/drain features in the edge region. Accordingly, the spot size may need to sufficiently cover that entire size of the source/drain feature. In some embodiments, a specific design of source/drain feature profile may require a certain part of the source/drain feature to be grown more than the other parts of the same source/drain feature. Accordingly, the spot size may only cover that specific region. Regions not targeted by the laser heating elements 80 may still receive the heating from the heating elements 90, 95. As a result, the difference in heating level may be achieved. For example, as described above, the relationship between the laser beam diameter S and the spot size $S_n$ on the substrate 5 is governed by the equation (IV) above. Accordingly, laser heating elements 80 may be rotated such that the outgoing laser beam 800 has an orientation that spans an angle θ from the z direction, that satisfies equation (VII):

$$\theta = \cos^{-1}\left(\frac{D'}{D}\right) = \cos^{-1}\left(\left(\frac{s'}{s}\right)^{1/2}\right) \quad \text{(VII)}$$

where S' is the desired spot size of the illuminated area on the substrate 5, D' is the desired spot diameter of the illuminated area on the substrate 5.

At step 114, the input power to the laser heating elements 80 may be adjusted such that the heating power received at the substrate 5 (e.g. at the target feature in the edge region) corresponds to the heating level differences with the inner portions, as determined from the step 110 (or previously known). As described above, in some embodiments, the heating power received at the target feature is determined by the angle θ, as well as the input power to the laser heating elements 80. As the angle θ is fixed based on the spot size, the input power is adjusted to achieve that desired heating power. The input power may be adjusted by any suitable means, such as by adjusting a magnitude of the current provided to the laser heating elements 80, by adjusting an attenuation level of a power adjuster on the route of the laser beam to the target features, etc.

At step 116, the laser heating element 80 may be moved along the slide 70, while maintaining the angle θ, so as to aim the laser beam 800 at the target area of the substrate 5. At this stage, the laser is ready for the execution of the deposition recipe. At step 118, any necessary gases are turned on and any predetermined deposition receipt may be initiated. The recipe is not limited, and an example recipe is provided later with respect to FIG. 11. At step 120, the deposition recipe is terminated and completed.

Figure 10:
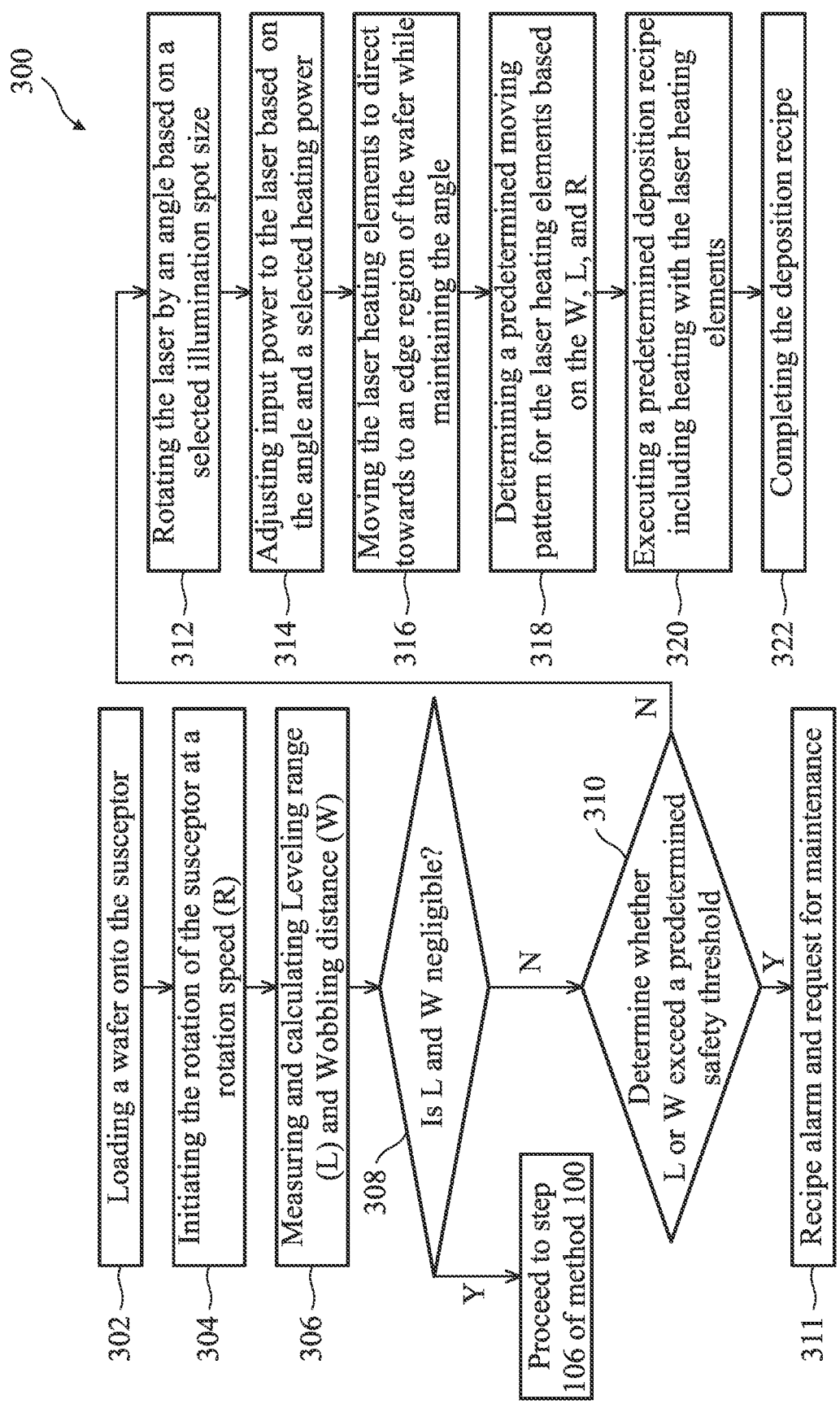

In some embodiments, the static-type embodiments of FIG. 9 may be insufficient in addressing the above-described wobbling or leveling challenges. Accordingly, the laser heating elements 80 may be configured to engage in movements (along the x-direction and/or the z-direction) or rotations in a predetermined manner during the deposition process. Referring to FIG. 10, a method 300 is illustrated which includes moving the laser heating elements 80 during the deposition process. At step 302, the substrate is loaded onto the susceptor. At step 304, the susceptor rotation starts at a rotation speed R. At step 306, the wobbling distance W and the leveling range L are measured. Any suitable methods may be used to measure W and L. At step 308, the L and W are evaluated to determine whether the magnitude of L or the magnitude of W is negligible to maintain sufficient heating power accuracy. This may be determined based on a predetermined tolerance threshold. If the answer is yes, the method 300 may proceed substantially similar to the method 100, starting at step 106 of method 100. If the answer is no for either L and W, the method 300 proceeds to determine whether L or W exceed a predetermined safety threshold. This safety threshold may be established based on the instrument safety protocols to avoid damages to instrument and/or to avoid accidents to operating personnel. If the answer is yes, an alarm is triggered at step 311, and the instrument is locked from further operation. Maintenance is meanwhile requested.

If the answer at step 310 is no, the method 300 proceeds to rotate the laser to achieve a desired spot size. The spot size may be determined similarly as described above with respect to FIG. 9. At step 314, the input power to the laser heating elements are adjusted based on a selected heating power and the rotate angle of the laser heating element. Although not specifically illustrated, the heating power may be selected following similar steps of steps 106-110 of method 100 (FIG. 9). At step 316, the laser heating element is moved along the x-axis to direct towards to an edge region of the substrate while maintaining the angle. At step 318, a predetermined moving pattern for the laser heating elements are determined based on the W, L, and R. For example, the laser heating elements 80 may shuttle, in a manner predetermined prior to the initiation of the step 110 of FIG. 9, between two extreme positions 80e' and 80e" (FIG. 5) in order to compensate for wobbling effects. For another example, the laser heating elements 80 may shuttle, in a manner predetermined prior to the initiation of the step 110 of FIG. 9, between two extreme positions 80z' and 80z" (FIG. 8) in order to compensate for leveling effects. For yet another example, the laser heating elements 80 may shuttle, in a manner predetermined prior to the initiation of the step 110 of FIG. 9, along both the x-direction and the z-direction to address both the wobbling effect and the leveling effect. In some embodiments, the details of the moving pattern, such as shuttling distances $\delta_x$, $\delta_z$, shuttling frequencies $\varphi_x$, $\varphi_z$ are determined based on equations (I) (II) (V) and (VI). At step 320, any suitable deposition recipe may be executed. The deposition recipe completes at step 322.

In some embodiments, the laser heating elements 80 not only moves and/or rotates during the deposition process, but also dynamically responds to certain data received during the process. In other words, the movement of the laser heating elements 80 are no longer predetermined prior to the execution of the deposition recipe, but rather dynamically determined during the process. Such embodiments may be referred to the dynamic-motion-type embodiments. In some embodiments, the movements of the laser heating elements 80 along the x-direction and/or the z-direction can no longer be determined entirely based on equations (I)-(II) or (V)-(VI). Moreover, in some embodiments, the rotation angle θ of the laser heating elements 80 around the y-axis may not be simply determined based on equation (III) or (IV). For example, the rotation angle θ may need be changed during the process. Furthermore, the power provided to the laser heating elements 80 may need be further adjusted dynamically. These parameters determine the dynamic movements of the laser heating elements 80 during the process. In some embodiments, the configuration for the laser heating elements 80 may be expressed as a function (VIII):

$$f(x,z,\theta) = f_x(W) f_z(L) f_\theta(P) \quad \text{(VIII)}$$

where $f$ is the position of laser source; W is the wobbling distance W; P is the heating power on the target area.

Figure 11:
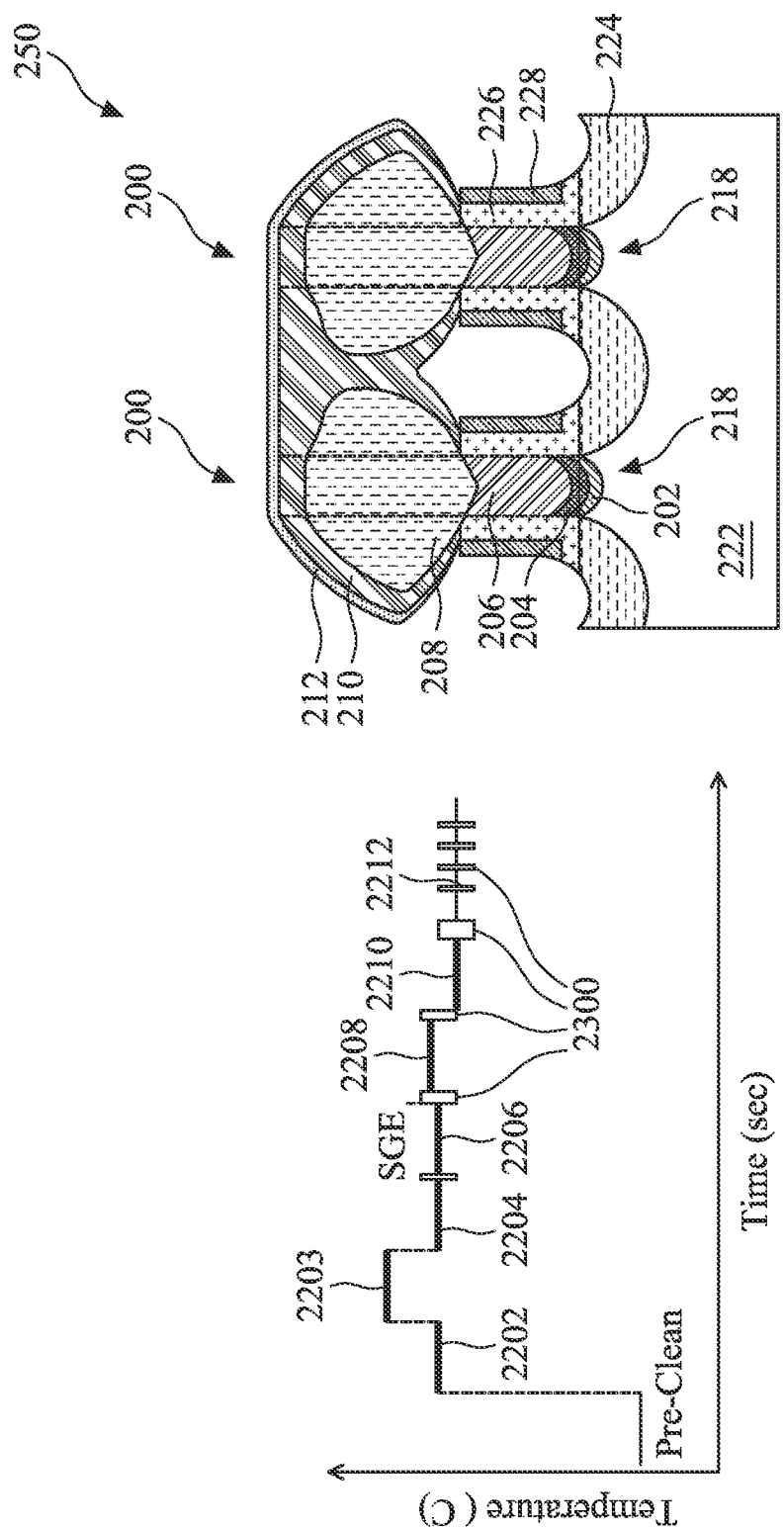
FIG. 11 is an example deposition recipe for an epitaxy feature according to some embodiments of the disclosure and the epitaxy feature so formed.
Figure 15:
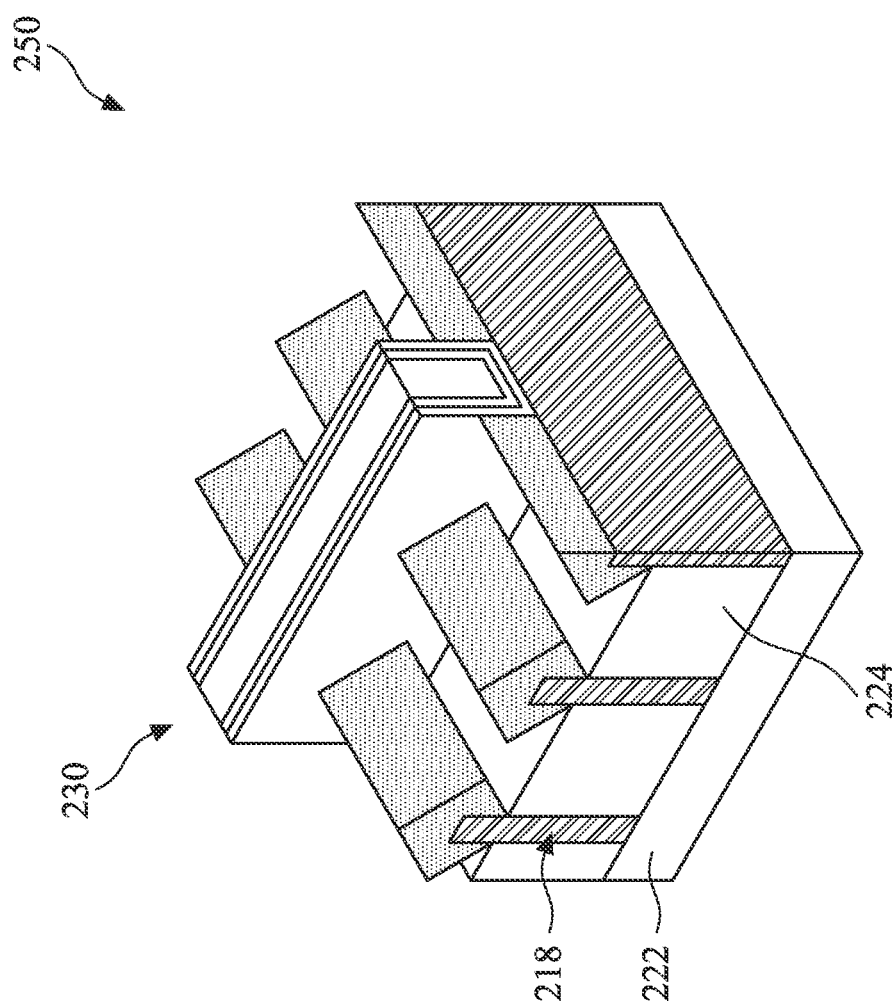
FIG. 15 is a perspective view of a semiconductor structure, constructed according to some embodiments of the present disclosure.

Although not specifically recited with respect to FIGS. 9 and 10, there may be more than one laser heating element 80. In some embodiments, each of them is similarly configured. In some embodiments, each of the laser heating elements 80 may be differently configured and collaborate to achieve the collective effect of improving uniformity and/or stability. Regardless whether static-type, predetermined motion-type, or dynamically determined motion-type embodiments are implemented, one example predetermined deposition recipe that can be executed (e.g. for the step 110 of FIG. 9 and for the step 320 of FIG. 10) is illustrated in FIG. 11. FIG. 11 also illustrates one example of a semiconductor structure 250 with an epitaxial feature formed thereon. The semiconductor structure 250 includes a semiconductor substrate 222 and isolation features 224 formed in the semiconductor substrate 222, thereby defining and separate active regions. the isolation features 224 may include shallow trench isolation (STI) features formed on the semiconductor substrate 222 by a suitable procedure, such as a procedure including: patterning the semiconductor substrate 222 to form trenches using lithography process and etching; depositing one or more dielectric material (silicon oxide, silicon nitride, or both, for example); performing a chemical mechanical polishing (CMP) process to remove excessive dielectric material and planarize the top surface. The fin active regions 218 are formed by either recessing STI features 224, epitaxial grow semiconductor material or both. The fin active regions 218 are continuously extended from the semiconductor substrate 222 and are protruded above the STI features 224. The semiconductor structure 250 further includes a gate 230 (shown in FIG. 15) disposed on the fin active region 218 and is engaging a channel layer of the fin active region 218. In some embodiments, the gate stack 230 includes a gate dielectric layer, a gate electrode disposed on the gate dielectric layer, and a gate spacer disposed on the sidewalls of the gate electrode. The gate spacer includes one or more dielectric material. The gate electrode and the gate dielectric layer are collectively referred to as a gate stack. In some embodiments, a dummy gate stack is initially formed using a suitable material (such as polysilicon) and is replaced with the gate stack at later fabrication stage. In some embodiment, the gate dielectric layer includes a high-k dielectric material; and the gate electrode includes metal or a metal alloy and may include multiple layers.

The semiconductor structure 250 also includes source and drain formed on the fin active region 218 and interposed by the gate 230. The source, drain, channel layer, and gate are configured as a field-effect transistor (FET). In some embodiments, the FET is a nanostructure transistor (e.g., multi bridge channel (MBC) transistor, nanowire transistor, nanosheet transistor, gate all around transistor, etc.), in which the channel includes multiple vertically-stacked channel layers. The source and drain are collectively referred to as epitaxial features 220.

The semiconductor structure 250 also includes one or more dielectric material disposed on the sidewalls of the fin active region 218, such as 226 and 228, collectively referred to as dielectric sidewall. In some embodiments, the dielectric sidewall of the fin active region 218 and the gate spacer of the gate 230 are collectively formed by one fabrication procedure. For example, after the gate stack (or dummy gate stack if the gate replacement is implemented) is formed on the fin active region 218, one or more dielectric material is formed the sidewalls of the gate stack and the sidewalls of the fin active region 218 using a suitable procedure, which may include deposition and anisotropic etch (such as plasma etch).

In some embodiments, the dielectric sidewall includes multiple dielectric material layers, such as dielectric material layers 226 and 228. In furtherance of the embodiments, the dielectric material layer 226 includes silicon nitride (SiN), and the dielectric material layer 228 includes silicon carbon nitride (SiCN) or silicon carbon oxynitride (SiCON). In some examples, the total thickness of the dielectric sidewall ranges between 2 nm and 5 nm. In some embodiments, the dielectric sidewall includes only one dielectric material layer, 226 or 228.

The source/drain regions of the fin active region 218 are recessed by an etching process, which selectively removes semiconductor material(s) of the fin active region 218 with one or more proper etchant, such as HBr, O2, N2, F, or a combination thereof to selectively remove silicon germanium, or Cl2, CCl2F2, Cl2, SF6, or a combination thereof to selectively remove silicon. In some embodiments, the fin active region 218 includes silicon germanium epitaxially grown on the silicon substrate for strain effect, the etching process removes silicon germanium in the source/drain regions and continues to recess the silicon substrate. In some embodiments, the fin active region 218 includes a stack of silicon germanium films and silicon films alternatively grown on the silicon substrate for strain effect, the etching process removes the stack of silicon germanium films and silicon films in the source/drain regions and continues to recess the silicon substrate.

Figure 17:
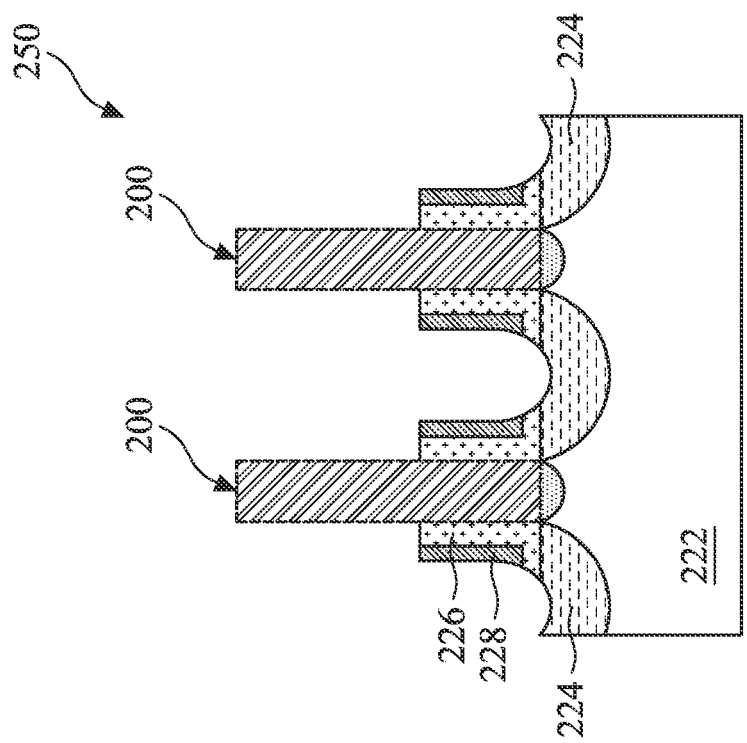
FIGS. 16 and 17 are cross-sectional views of the semiconductor structure, constructed according to some embodiments of the present disclosure.
Figure 16:
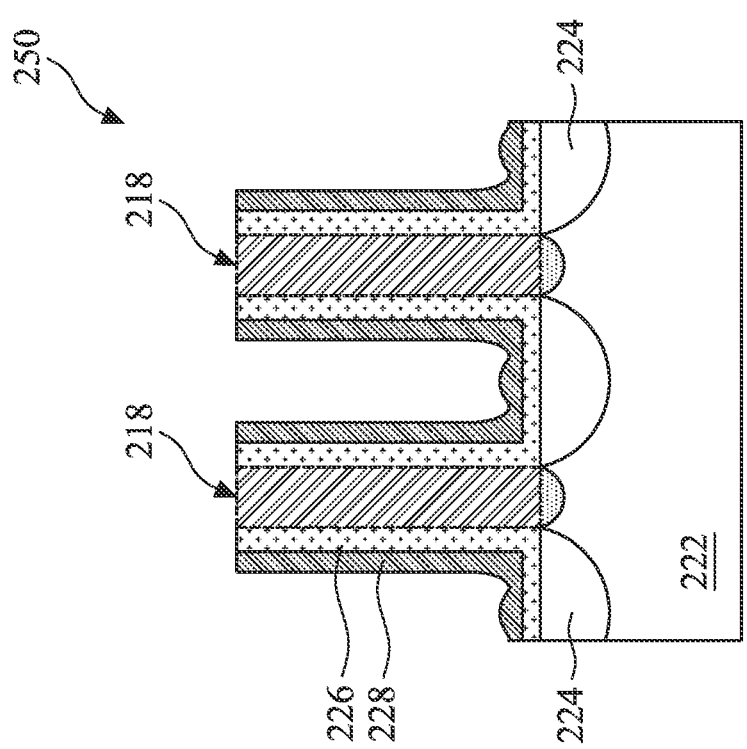

Thereafter, source and drain features are epitaxially grown in the recesses of the fin active region 218 within the source/drain regions. The source and drain features are collectively referred to as epitaxial features 200, as illustrated in FIG. 16. According to some embodiments, after the formation of the epitaxial features 200, the fin sidewall is recessed by an etching process with one or more suitable etchant to selectively reduce the corresponding height of the fin sidewalls, as illustrated in FIG. 17. In some examples, the height of the recessed fin sidewalls ranges between 2 nm and 20 nm.

The epitaxial features 200 are formed by a suitable procedure that include one or more selective epitaxial growth steps, which are further described in detail, with reference to FIG. 11.

In some embodiments, the deposition recipe includes conducting a selective growth etching (SEG) process. In some embodiments, the deposition recipe includes conducting a cyclic deposition etching (CDE) process. In the depicted embodiment of FIG. 11, the deposition recipe starts from a pre-cleaning operation on the substrate 5. Then, a seed layer 202 may be deposited in a deposition operation 2202. In some embodiments, a baking operation 2203 is conducted, such as in hydrogen (H2) environment. Another deposition operation 2204 is conducted to form another seed layer 204. In furtherance of the embodiments, the seed layer 202 is a silicon layer deposited using a suitable precursor, such as SiH4, and the seed layer 204 is a silicon germanium layer deposited using a suitable precursor, such as SiH4 and GeH4. A plurality of SGE deposition operations are conducted to form epitaxial layers 206, 208, and 210, respectively. In some embodiments, the epitaxial layer 206 is a silicon germanium layer doped with boron; the epitaxial layer 208 is a silicon germanium layer doped with boron; and the epitaxial layer 210 is a silicon germanium layer doped with boron as well, with respective deposition temperature. The precursors to form those epitaxial layers may further include dopant-containing chemicals, such as borohydride (BH4) when boron is used as dopant. Moreover, after each of the plurality of the SGE deposition operations, an etching operation 2300 is conducted, such as using hydrochloride (HCl). In the present embodiment, the SGE deposition operations for the epitaxial layers 206, 208, and 210 are performed at different temperatures. In some embodiments, an epitaxial cap layer 212 is formed in a CDE deposition operation 2212 using Si and Ge containing chemicals, dopant containing chemical and further including etching chemical such as HCl. In some embodiments, the operation 2212 is a cyclic process with multiple cycles, in which each cycle includes one step of deposition and one step of etching using respective chemicals, in order to avoid undesired growth and control the shape of the epitaxial feature 200. The number of the cycles of the CDE deposition operation 2212 may be 4, 5, 6 or 7 according to some embodiments. However, it is not intended to be limiting, and any number of cycles is proper, depending individual application including desired shape. During each cycle of the CDE deposition operation 2212, the deposition includes a deposition chemical, such as SiH4, Ge4 and boron-containing gas; and the etching process includes an etchant, such as HCl. In some examples, the etching process further includes germanium-containing gas, such as GeH4 in addition to the etchant (e.g., HCl) to accelerate the etching effect.

Furthermore, the above processes may be implemented at different temperature and may use the semiconductor processing apparatus 1000 to achieve desired thermal effect, such as uniform heating effect. Particularly, the laser heating elements 80 may be employed (i.e. turned on and utilized) in each of the plurality of deposition operations 2206, 2208, 2210, and 2212 to maximally improve heating stability and uniformity. In some embodiments, certain epitaxial layers may not contribute substantially towards the performance in certain applications. Accordingly, the laser heating elements 80 may be not employed (i.e. turned off, directed away, or otherwise not utilized) in such deposition operations to, for example, save on costs, improve production speed, etc. In the disclosed embodiment, various semiconductor layers 204-212 are made of a semiconductor material, such as SiGe:B, and corresponding depositions deposition temperatures and processing temperatures of other operations are different and are individually designed to form the epitaxial feature 200 with enhanced performance, as illustrated in FIG. 11. For example, the baking temperature at operation 2203 is higher than the preclean temperature and the temperatures of various SiGe:B deposition and CDE process. The first SEG deposition at the operation 2206 includes a first deposition temperature T1; the second SEG deposition at the operation 2208 includes a second deposition temperature T2; the third SEG deposition at the operation 2210 includes a third deposition temperature T3; and the CDE deposition at the operation 2212 includes a fourth deposition temperature T4. Temperatures T1, T2, T3 and T4 are different. Especially, T2 is greater than T1, T3 is less than T1, and T4 is substantially same as T3. The difference of T3 and T4 is less than 5%. In the present embodiment, the epitaxial feature 200 is a p-type source/drain feature and the corresponding FET is a p-type FET. Especially, the epitaxial feature 200 includes silicon germanium epitaxially grown on a silicon substrate to achieve desired strain effect to enhance carrier mobility.

As a result, in some embodiments, the epitaxial features 200 in different regions of the substrate 5 may have improved uniformity relative to one another, as compared to approaches not implementing embodiments of the present disclosure (such as not using the laser heating elements 80). Moreover, in some embodiments, the deposition operations 2202 and 2204 may also utilize the laser heating elements 80 as described herein. Although FIG. 11 illustrates only certain number of epitaxial layers, any suitable number of epitaxial layers may implement the methods and apparatus described here. Moreover, each of the epitaxial layers 206, 208, 210, and 212 may include one or more sub-layers. For example, the deposition operation 2208 may include a number of sub-steps 2208a, 2208b, 2208c, etc. Each of these sub-steps produces a sublayer for the epitaxial layer 208, e.g. sublayers 208a, 208b, 208c, etc. In some embodiments, these sublayers may differ in dopant concentrations (such as a boron dopant) in the sublayers. In some embodiments, one or more of the plurality of sub-steps 2208a, 2208b, 2208c, etc. may employ the laser heating elements 80, while the other sub-steps may not employ the laser heating elements 80. For example, certain sublayer (or portion) of the source/drain features may not be particularly critical for a certain application, such that implementing the present disclosure may turn out to be too costly to justify any benefit.

Figures 12, 13:
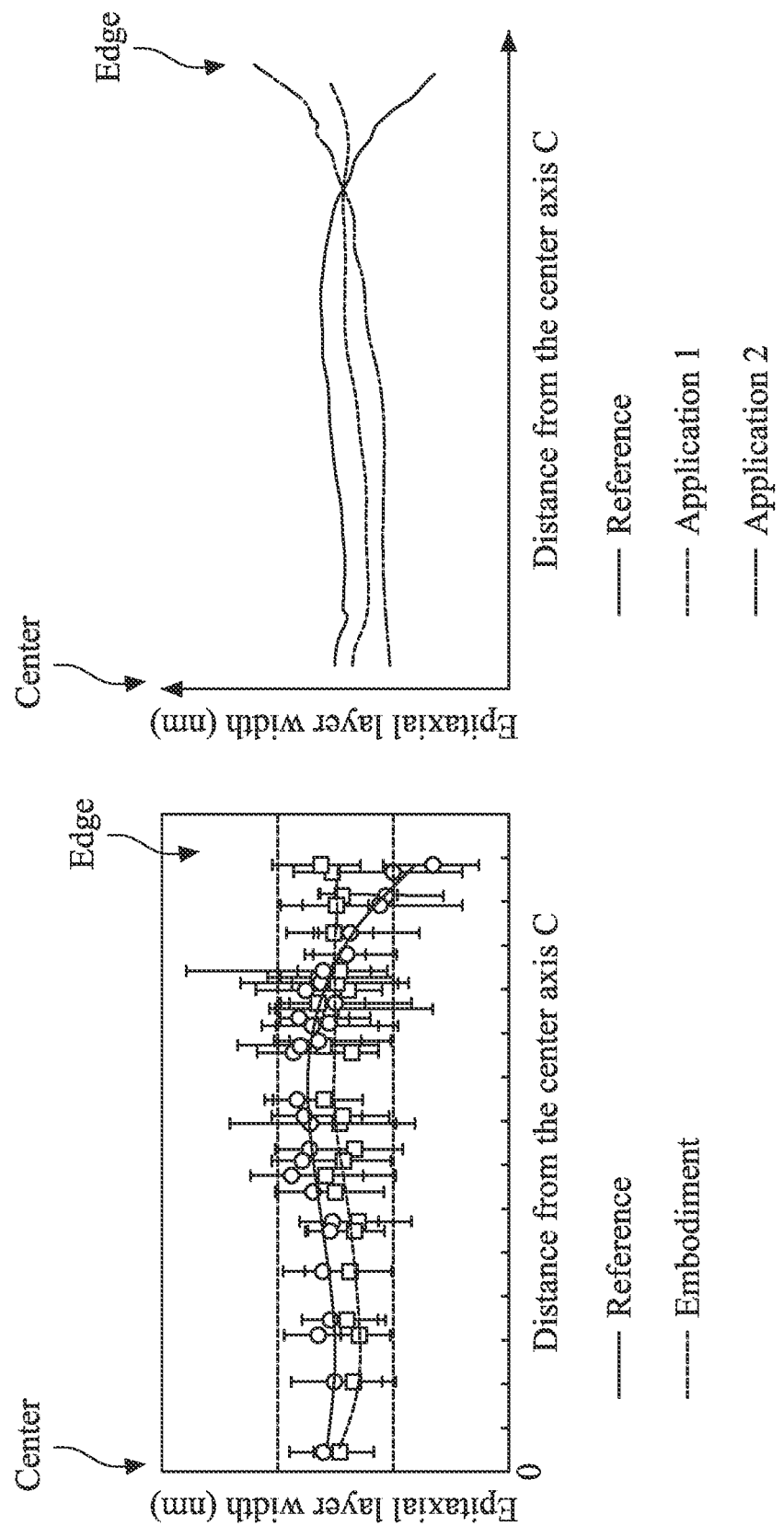
FIGS. 12, 13, and 14 are figures illustrating the control of feature width provided by the apparatus according to some embodiments of the disclosure.

Accordingly, according to some embodiments of the present disclosure, movable laser heating elements are provided on the apparatus 1000 to enable localized heating, thereby providing for precise control of the feature dimensions and profiles. The feature growths are thereby better controlled and have improved uniformity. For example, FIG. 12 illustrates the statistical analysis of the lateral width dimensions of epitaxial source/drain feature of a Static random-access memory (SRAM) cell on different regions of the substrate 5. The reference curve illustrates the data obtained without implementing the laser heating elements 80 described in this present disclosure; while the embodiment curve illustrates the data obtained by implementing one embodiment of the present disclosure. As illustrated, without implementing embodiments of the present disclosure, the widths of the epitaxial layer fabricated varies significantly along the radius direction of the substrate 5. For instance, in the edge regions having a large distance from the center axis C, the widths of the epitaxial layer drop substantially (e.g. by about 15% to about 25%). By contrast, by implementing an embodiment of the present disclosure, the uniformity in the epitaxial layer widths is significantly improved. For example, the variation in the widths of the epitaxial layer in the edge region as compared to the inner regions are less than about 5%. In some embodiments, the variation in the widths of the epitaxial layer in the edge region as compared to the inner regions are less than about 2%.

FIG. 13 provides additional examples. Referring to the curve illustrating "Application 1", similar to that shown in FIG. 12, the uniformity of the uniformity in the epitaxial layer widths is significantly improved. Furthermore, in some embodiments, the profiles of the epitaxial layer may be specifically altered, based on design needs, to those previously difficult to achieve. For example, referring to the Application 2 situation of FIG. 13, by implementing embodiments of the present disclosure, the lateral widths of the epitaxial feature may be controlled such that the edge portion has widths substantially greater than that of the inner portions. In other words, embodiments of the present disclosure provide full control in adjusting feature dimensions and sizes, which were previously challenging or infeasible.

Figure 14:
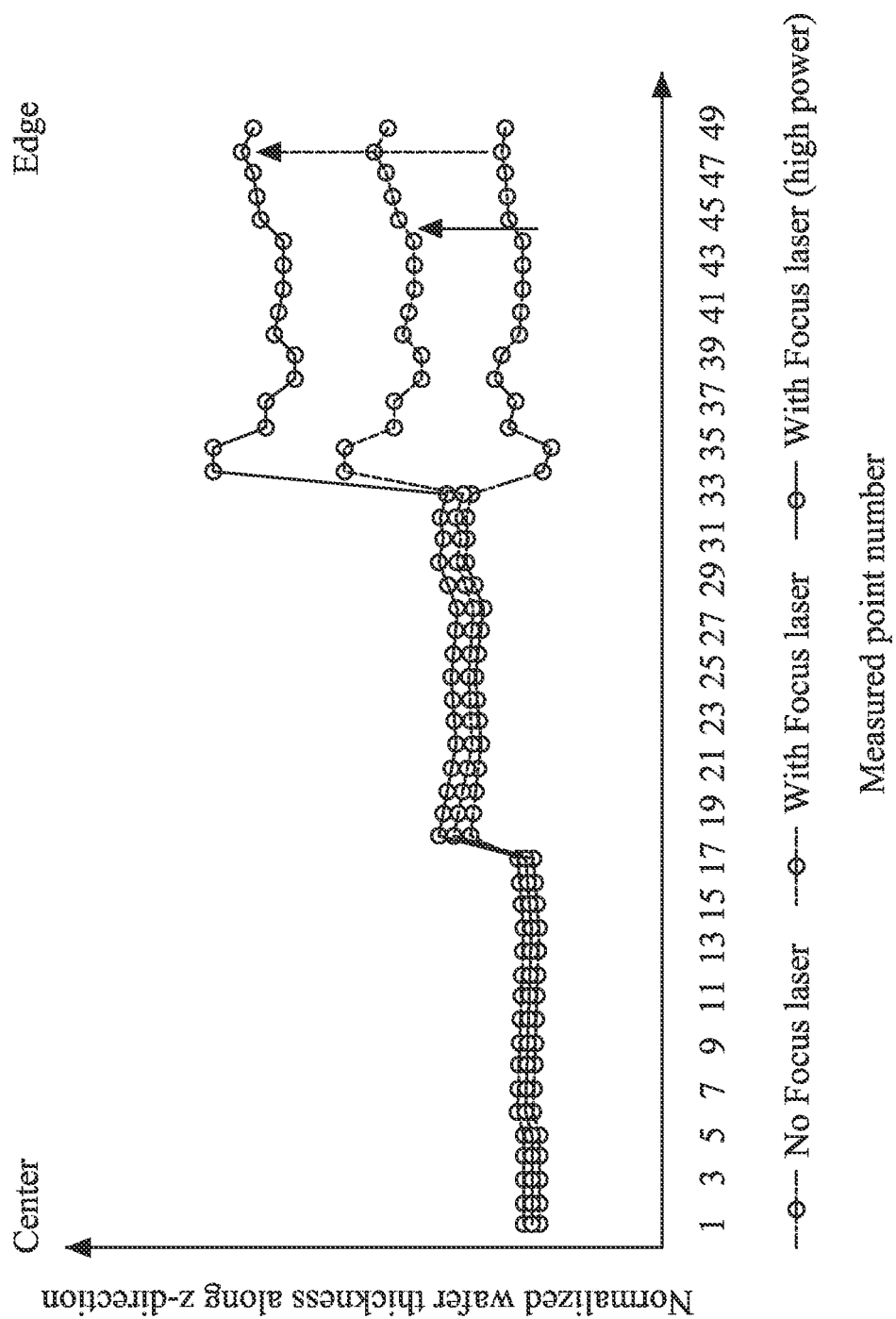

Referring to FIG. 14, the power to the laser may be adjusted such that the amount of heating provided to target areas on the substrate 5 may be controlled. As a result, the thickness or lateral widths of the epitaxial features may be well controlled. For example, by increasing the laser output power from about 10 W to about 120 W, the overall thickness of the substrate may increase from about 1 nm to about 100 nm. Therefore, FIG. 14 illustrates that by specifically providing laser power of the laser heating elements 80 to an edge region of the substrate 5, the thickness of the epitaxial features in that region are may be specifically tuned and controlled.

Although the disclosure above describes the laser heating elements 80 being positioned above the susceptor 20 and above the heating elements 90, 95, in some embodiments, the laser heating elements 80 being positioned between the susceptor 20 and the heating elements 90, 95. In such embodiments, the laser heating elements 80 still project the laser beam (or heating radiation) on a top surface of the substrate 5. Alternatively, the laser heating elements 80 may instead be positioned below the susceptor 20. In such embodiments, the laser heating elements 80 may project the laser beam (or heating radiation) on a bottom surface of the susceptor 20, and affect the processing of the substrate 5 by way of heat conduction.

Accordingly, embodiments of the present disclosure enable improved device design and processing capabilities.

Although the disclosure uses the growth of epitaxial features as an example, the same or similar methodologies may be adopted in the fabrication of other suitable device features. In some embodiments, any film growing process and epitaxy processes may implement the apparatus described here. For example, CVD thin film deposition for forming silicon liners may implement the present disclosure. For example, fabrications of planar CMOS, FinFET transistors, nanosheet-based transistors, Gate-all-around (GAA) transistors, surrounding-gate transistor (SGT), other multi-gate transistors, III-V device, may implement aspects of the present disclosure. Moreover, any other processes that require heating and/or light sources may implement aspects of the present disclosure.

Different embodiments may provide different benefits, and not all benefits are required for any specific embodiment. In an exemplary aspect, the present disclosure is directed to a device. In one example aspect, the present disclosure provides a semiconductor processing apparatus. The semiconductor processing apparatus includes a chamber; a base station located in the chamber for supporting a semiconductor substrate; a preheating assembly surrounding the base station; a first heating element fixed relative to the base station and configured to direct heat to the semiconductor substrate; and a second heating element moveable relative to the base station and operable to direct heat to a portion of the semiconductor substrate.

Another one aspect of the present disclosure pertains to a method of semiconductor fabrication. The method includes providing a substrate onto a base station of an apparatus, the apparatus further including a first heating element fixed relative to the base station and a second heating element movable relative to the base station, the second heating element operable to generate a columnated radiation; initiating rotation of the substrate; initiating heating from the first heating element on the substrate; moving the second heating element to direct heating to a region of the substrate; and executing a deposition recipe under heating provided by the first heating element and by the second heating element.

Yet another aspect of the present disclosure pertains to a method of semiconductor fabrication. The method includes providing a substrate onto a base station of an apparatus, the apparatus further including heating lamps surrounding the base station and a laser heating element movable relative to the base station; measuring a heating level difference provided by the heating lamps on a first region of the substrate and a second region of the substrate; configuring the laser heating element to provide a heating having a magnitude corresponding to the heating level difference; and executing an epitaxy deposition process using the heating lamps and the laser heating element. The deposition process includes a first selective epitaxial growth to form a first semiconductor layer of a semiconductor material with a first deposition temperature T1, a second selective epitaxial growth to form a second semiconductor layer of the semiconductor material with a second deposition temperature T2, a third selective epitaxial growth to form a third semiconductor layer of the semiconductor material with a third deposition temperature T3, and a cyclic deposition/etching process to form a fourth semiconductor layer of the semiconductor material with a fourth deposition temperature T4, wherein T1, T2 and T3 are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate onto a base station of an apparatus, the apparatus further including a first heating element fixed relative to the base station and a second heating element movable relative to the base station, the second heating element being operable to generate a columnated radiation;
initiating rotation of the substrate;
initiating heating from the first heating element on the substrate;
moving the second heating element to direct heating to a region of the substrate; and
executing a deposition recipe under heating provided by the first heating element and by the second heating element, wherein the moving of the second heating element includes vertically moving the second heating element along a direction perpendicular to a top surface of the base station and in response to a leveling motion of the base station.

2. The method of claim 1, wherein the moving of the second heating element includes rotating the second heating element by an angle based on a selected illumination spot size and linearly moving the second heating element along a slide.

3. The method of claim 1, wherein the moving of the second heating element includes shuttling the second heating element at a frequency determined based on a rotation speed of the substrate.

4. The method of claim 1, further comprising determining a leveling range L of the substrate,
wherein the moving of the second heating element includes shuttling the second heating element between two extremely positions separated by a distance $\delta_z$ at a shuttling frequency $\varphi_z$,
wherein the distance $\delta_z$ is linearly correlated with the leveling range L, and the shuttling frequency $\varphi_z$ is inversely correlated with a rotation speed R of the substrate.

5. The method of claim 1, wherein the moving of the second heating element includes rotating the second heating element about an axis parallel to a top surface of the base station, such that a radiation beam from the second heating element spans an angle θ from a vertical direction,
wherein the angle θ is determined from a size S of the radiation beam on a plane perpendicular to a propagating direction of the radiation beam and a size S' of the radiation beam on the substrate, according to equation $$\theta = \cos^{-1}\left(\left(\frac{s'}{s}\right)^{1/2}\right).$$

6. The method of claim 1, further includes terminating the moving of the second heating element prior to the executing of the deposition recipe.

7. The method of claim 1, wherein the executing of the deposition recipe includes executing while maintaining a movement of the second heating element.

8. The method of claim 1, wherein
the first heating element includes a first lamp module fixed to the apparatus at a level above the substrate secured on the apparatus and a second lamp module fixed to the apparatus at a level below the substrate; and
the second heating element includes laser heating elements configured to provide localized heating.

9. A method, comprising:
providing a substrate onto a base station of an apparatus, the apparatus further including heating lamps fixed relative to the base station and a laser heating element movable relative to the base station, the laser heating element being operable to generate a columnated radiation;
initiating rotation of the substrate;
initiating heating from the first heating element on the substrate;
moving the laser heating element to direct heating to a region of the substrate; and
executing a deposition recipe under heating provided by the heating lamps and by the laser heating element, wherein the moving of the second heating element includes vertically moving the second heating element along a direction perpendicular to a top surface of the base station and in response to a leveling motion of the base station.

10. The method of claim 9, wherein
the heating lamps further include a first subset fixed at a level above the base station and a second subset fixed at a level below the base station;
the first subset of the heating lamps is configured to heat an inner zone of the substrate; and
the second subset of the heating lamps is configured to heat an outer zone of the substrate.

11. The method of claim 9, wherein the laser heating element is slidably attached to a slide fixed relative to the base station.

12. The method of claim 11, wherein the moving of the laser heating element includes rotating the laser heating element by an angle based on a selected illumination spot size and linearly moving the laser heating element along the slide.

13. The method of claim 9, wherein the executing a deposition recipe under heating includes providing the collimated radiation having a spot size of about 10 mm to about 18 mm by the laser heating element.

14. The method of claim 9, wherein the moving of the second heating element includes rotating the second heating element about an axis parallel to a top surface of the base station, such that a radiation beam from the second heating element spans an angle θ from a vertical direction,
wherein the angle θ is determined from a size S of the radiation beam on a plane perpendicular to a propagating direction of the radiation beam and a size S' of the radiation beam on the substrate, according to equation
$\theta = \cos^{-1}((S'/S)^{1/2})$.

15. The method of claim 9, wherein the executing of the deposition recipe includes executing the deposition recipe while maintaining a movement of the second heating element.

16. The method of claim 9, wherein the executing of the deposition recipe under heating provided by the heating lamps and by the laser heating element includes
performing a first selective epitaxial growth to form a first semiconductor layer of a semiconductor material with a first deposition temperature T1,
performing a second selective epitaxial growth to form a second semiconductor layer of the semiconductor material with a second deposition temperature T2,
performing a third selective epitaxial growth to form a third semiconductor layer of the semiconductor material with a third deposition temperature T3, and
performing a cyclic deposition/etching process to form a fourth semiconductor layer of the semiconductor material with a fourth deposition temperature T4, wherein T1, T2 and T3 are different.

17. A method, comprising:
providing a substrate onto a base station of an apparatus, wherein the apparatus further includes heating lamps fixed relative to the base station and a laser heating element is slidably attached to a slide fixed relative to the base station and is operable to generate a columnated radiation;
initiating rotation of the substrate;
initiating heating from the first heating element on the substrate; and
executing a deposition recipe under heating provided by the heating lamps and the laser heating element, wherein the executing of the deposition recipe includes executing the deposition recipe while vertically moving the second heating element along a direction perpendicular to a top surface of the base station.

18. The method of claim 17, wherein the executing of the deposition recipe includes rotating the laser heating element by an angle based on a selected illumination spot size and linearly moving the laser heating element along a slide.

19. The method of claim 17, wherein the executing of the deposition recipe includes shuttling the laser heating element at a frequency determined based on a rotation speed of the substrate.

20. The method of claim 19, further comprising determining a leveling range L of the substrate, wherein the shuttling the laser heating element includes shuttling the laser heating element between two extremely positions separated by a distance $\delta_z$ at a shuttling frequency $\varphi_z$, and wherein the distance $\delta_z$ is linearly correlated with the leveling range L, and the shuttling frequency $\varphi_z$ is inversely correlated with a rotation speed R of the substrate.

* * * * *